US012690151B2

(12) United States Patent
Kim et al.

(10) Patent No.: US 12,690,151 B2
(45) Date of Patent: Jul. 21, 2026

(54) DISPLAY DEVICE

(71) Applicant: LG Display Co., Ltd., Seoul (KR)

(72) Inventors: Han Seok Kim, Paju-si (KR); Tae Young Jung, Paju-si (KR); Eun Jeong Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 121 days.

(21) Appl. No.: 18/643,471

(22) Filed: Apr. 23, 2024

(65) Prior Publication Data

US 2024/0365479 A1 Oct. 31, 2024

(30) Foreign Application Priority Data

Apr. 28, 2023 (KR) ........................ 10-2023-0056281

(51) Int. Cl.
H05K 5/30 (2025.01)
H05K 5/03 (2006.01)
H10H 29/14 (2025.01)

(52) U.S. Cl.
CPC ................. H05K 5/30 (2025.01); H05K 5/03 (2013.01); H10H 29/142 (2025.01)

(58) Field of Classification Search
CPC ....... H05K 5/0017; H05K 5/0217; H05K 5/30
USPC ................................. 361/807, 809, 810, 728
See application file for complete search history.

(56) References Cited

U.S. PATENT DOCUMENTS

| | | | | |
|---|---|---|---|---|
| 2022/0217856 A1* | 7/2022 | Li | .............................. | G09F 7/20 |
| 2023/0027649 A1* | 1/2023 | Hong | ......................... | G09F 9/33 |
| 2023/0046091 A1 | 2/2023 | Choi et al. | | |
| 2023/0126724 A1* | 4/2023 | Hong | .................... | H01L 25/075 |
| | | | | 257/91 |
| 2023/0253388 A1 | 8/2023 | Chung et al. | | |
| 2023/0290916 A1 | 9/2023 | Um et al. | | |

FOREIGN PATENT DOCUMENTS

| | | | | |
|---|---|---|---|---|
| KR | 20150110910 A | * 10/2015 | ......... | H10H 20/8581 |
| KR | 10-2022-0072535 A | 6/2022 | | |
| KR | 20230001334 A | * 1/2023 | ............... | F16B 5/02 |
| KR | 10-2023-0022418 A | 2/2023 | | |
| KR | 10-2023-0023482 A | 2/2023 | | |
| KR | 10-2023-0024469 A | 2/2023 | | |
| WO | WO-2022169154 A1 | * 8/2022 | ............. | G09F 9/302 |

* cited by examiner

*Primary Examiner* — Hung S. Bui

(74) *Attorney, Agent, or Firm* — Seed Intellectual Property Law Group LLP

(57) ABSTRACT

A display device includes a frame and display modules coupled to the frame. Each of the display modules includes a display panel including a protection layer for covering a side line formed on a side surface of a substrate of the display panel, and a cover film disposed on a first or front surface of the display panel. The display modules are spaced apart from each other when they are coupled to the frame, and a separation distance between the side surfaces of the protection layers and a separation distance between the side surfaces of the cover films of the plurality of display modules are the same.

13 Claims, 28 Drawing Sheets

100

DISPLAY DEVICE

CROSS-REFERENCE TO RELATED APPLICATION

This application claims priority to and the benefit of Korean Patent Application No. 10-2023-0056281, filed on Apr. 28, 2023, the disclosure of which is incorporated herein by reference in its entirety.

BACKGROUND

Technical Field

The present disclosure is generally directed to a display device, and more specifically, but not exclusively, to a display device in which a plurality of display modules are coupled together.

Description of the Related Art

Recently, display devices using light emitting diodes (LEDs), which are inorganic light emitting elements, as light emitting elements for pixels are attracting attention as next-generation display devices Methods of manufacturing a display device by tiling a plurality of display panels rather than manufacturing a large-area flat panel display device on a single substrate have been proposed.

However, there are a number of deficiencies and drawbacks of tiling multiple displays. For example, assembly tolerances can lead to formation of a step between the plurality of display modules in an assembly process, and the step produces a seam in a boundary area is visible. This seam is visible to the user or viewer and generally detracts from the appearance of the display. Accordingly, it would be advantageous to have display devices that overcome the deficiencies and disadvantages of known devices and methods.

BRIEF SUMMARY

Organic light emitting diode (OLED) display devices reproduce images by allowing OLEDs disposed in each pixel to emit light according to input image signals. Since an OLED display device has a fast pixel response time, high luminous efficiency and brightness, and a wide viewing angle and may express a black gradation in perfect black, the OLED display device has an excellent contrast ratio and an excellent color gamut. The OLED display device does not require a backlight unit.

Since an LED is made of an inorganic material, the LED does not require a separate encapsulation layer for protecting an organic material from moisture and is more reliable and has a longer lifetime than the OLED. In addition, the LED has a fast lighting speed, excellent luminous efficiency, and impact resistance.

Display devices that are formed or assembled by tiling multiple separate devices are called a tiling display device (or a tiled display device), and such a tiling display device can minimize an area in which images are not implemented between modules by tiling a plurality of display modules at a set distance, thereby implementing one image without partition lines entirely. While both OLED and LED devices may be suitable for use in a tiled display device, the present disclosure will proceed to describe example devices that incorporate LED elements to display images due to the advantages of LEDs mentioned above.

Embodiments of the disclosure are directed to providing a display device in which an assembly step between a plurality of display modules can be reduced.

In addition, embodiments are directed to providing a display device in which a plurality of display modules can be planarized without separate equipment.

A display device according to one aspect of the present disclosure includes a frame and a plurality of display modules coupled to the frame, wherein each of the plurality of display modules includes a display panel including a protection layer which covers a side line formed on a side surface of a substrate, and a cover film disposed on one surface of the display panel, the plurality of display modules are disposed to be spaced apart from each other in a state of being coupled to the frame, and a separation distance between side surfaces of the protection layer and a separation distance between side surfaces of the cover films of the plurality of display modules are the same.

A display device according to another aspect of the present disclosure includes a frame, a plurality of display modules coupled to the frame, and fixing members configured to fix the plurality of display modules to the frame, wherein the plurality of display modules are disposed to be spaced apart from each other in a state of being coupled to the frame, each of the plurality of display modules includes a display panel and a cover bottom which is disposed on one surface of the display panel and on which a plurality of protrusions are disposed, the frame includes a plurality of insertion holes into which the plurality of protrusions are inserted, and the fixing members fix the protrusions to the insertion holes.

The embodiments of the disclosure are not limited to the above-described embodiments, and further embodiments and aspects that are not mentioned above will be able to be clearly understood by those skilled in the art from the following description.

DETAILED DESCRIPTION

Advantages and features of the disclosure disclosed in the present disclosure and methods for achieving them will become clear with reference to embodiments described below in detail together with the accompanying drawings. The present disclosure is not limited to the embodiments disclosed below but can be implemented in various different forms, and these embodiments are merely provided to make the disclosure of the present disclosure complete and fully inform those skilled in the art to which the present disclosure pertains of the scope of the present disclosure. The scope of the appended claims is not limited by the disclosure.

In describing the present disclosure, when it is determined that the detailed description of a related known technology may unnecessarily obscure the gist of the present disclosure, detailed description thereof will be omitted.

When the terms "comprise," "include," "have," and "consist of" described in the present disclosure are used, other parts may be added unless "only" is used. When a component is expressed in the singular, it can be construed as a plurality of components unless specifically stated otherwise.

When the position relationship and interconnection relationship between two components, such as "on," "above," "under," "next to," "connected or coupled," "crossing or intersecting," or the like described, one or more other components may be interposed between the components unless the term "immediately" or "directly" is described.

When the temporal relationship is described using the term "after," "subsequently," "then," "before," or the like, it may include a non-consecutive case unless the term "immediately" or "directly" is used.

Although the term "first," "second," or the like may be used to distinguish components, functions or structures of the components are not limited by the ordinal number or component name added to the front of the component.

The following embodiments may be partially or fully coupled or combined, and various technological interworking and driving are possible. The embodiments may be implemented independently of each other and implemented together in the associated relationship.

Terms (including technical and scientific terms) used in embodiments of the present disclosure may be construed as meaning that may be generally understood by those skilled in the art to which the present disclosure pertains unless explicitly specifically defined and described, and the meanings of the commonly used terms, such as terms defined in a dictionary, may be construed in consideration of contextual meanings of related technologies.

Hereinafter, embodiments according to the present disclosure will be described in detail with reference to the accompanying drawings.

Figure 1:
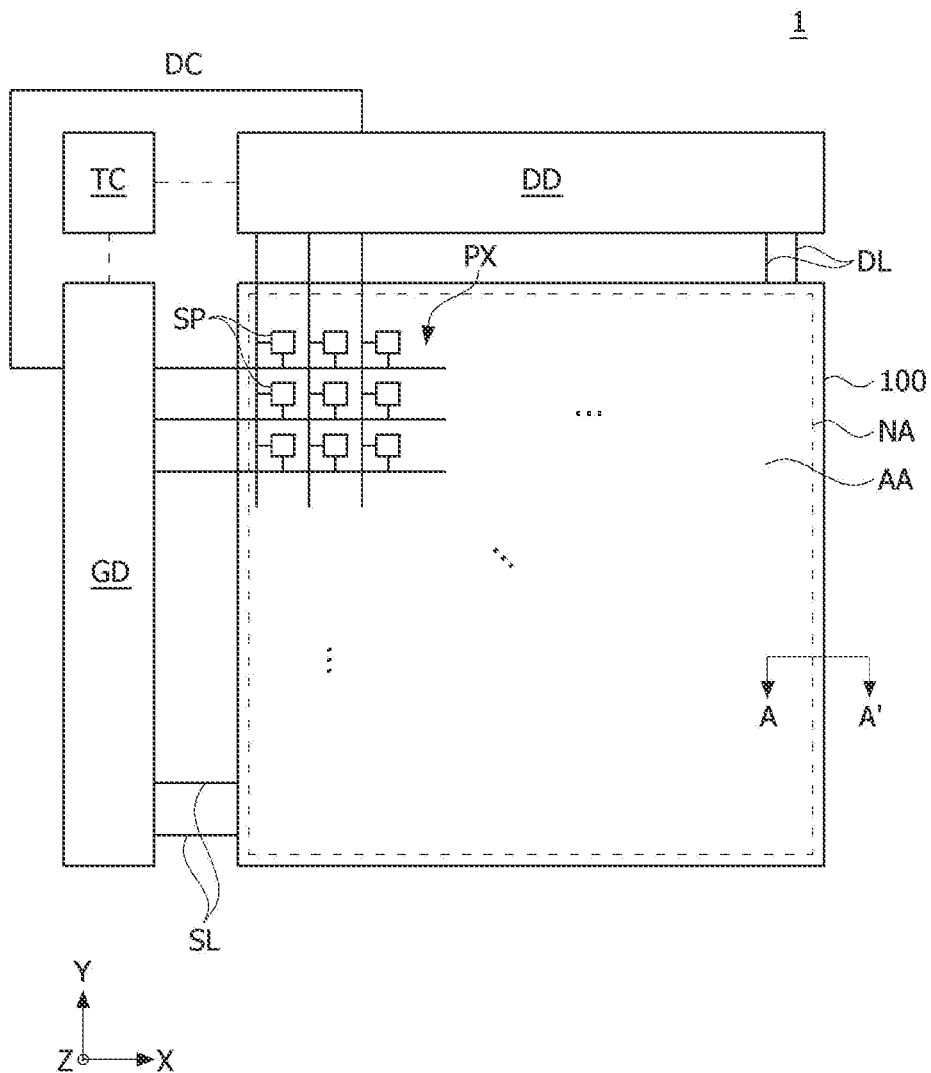
FIG. 1 is a block diagram schematically showing a configuration of a display device including a display panel according to an embodiment of the present disclosure.
Figure 2:
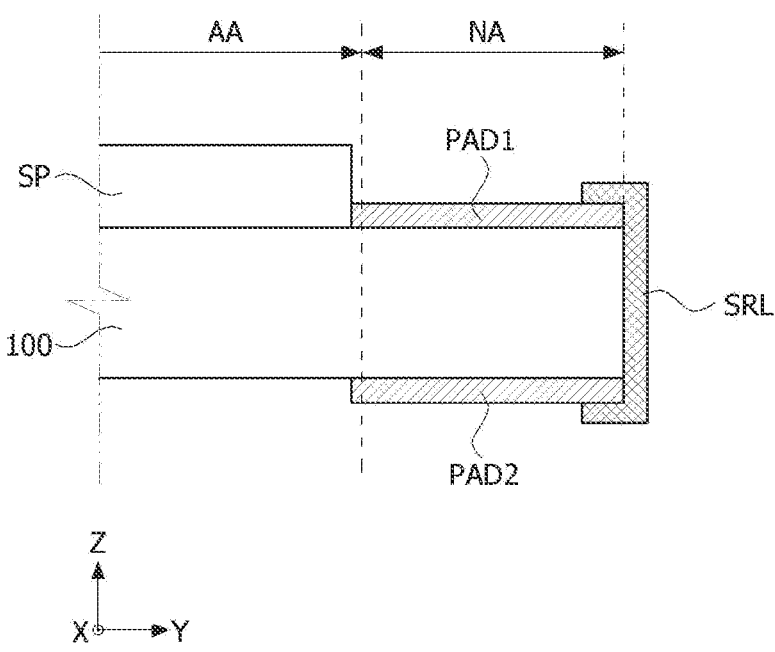
FIG. 2 is a partial cross-sectional view of the display panel of FIG. 1 along line A-A' in FIG. 1 showing a pad and a side line disposed on an outermost portion of the display panel.
Figure 3:
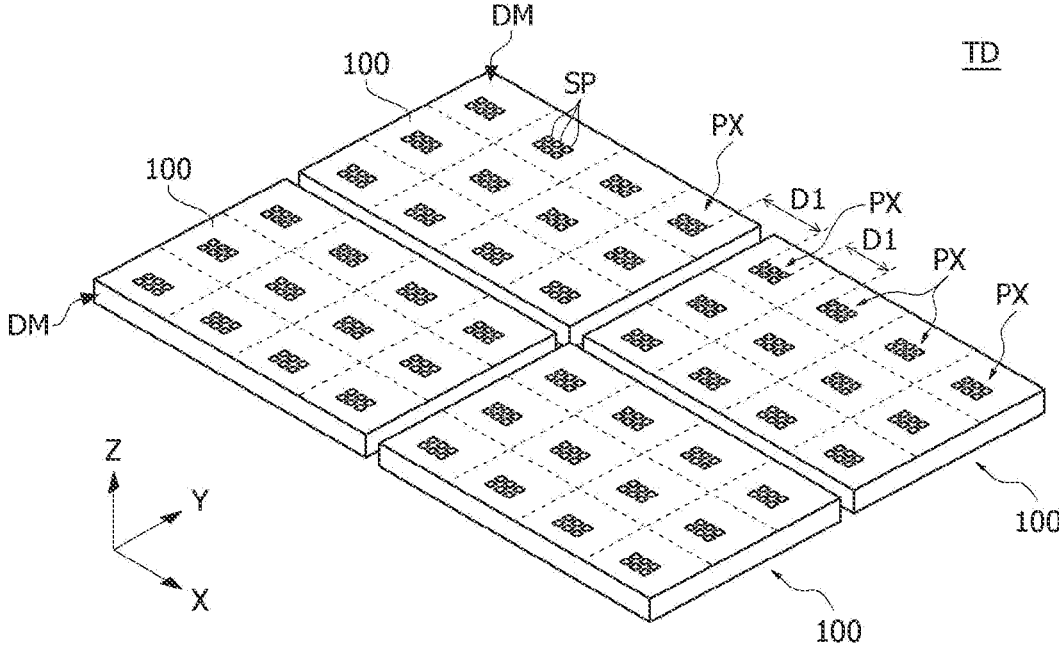
FIG. 3 is a perspective view showing a tiling display device including a plurality of display panels of FIG. 1.
Figure 4:
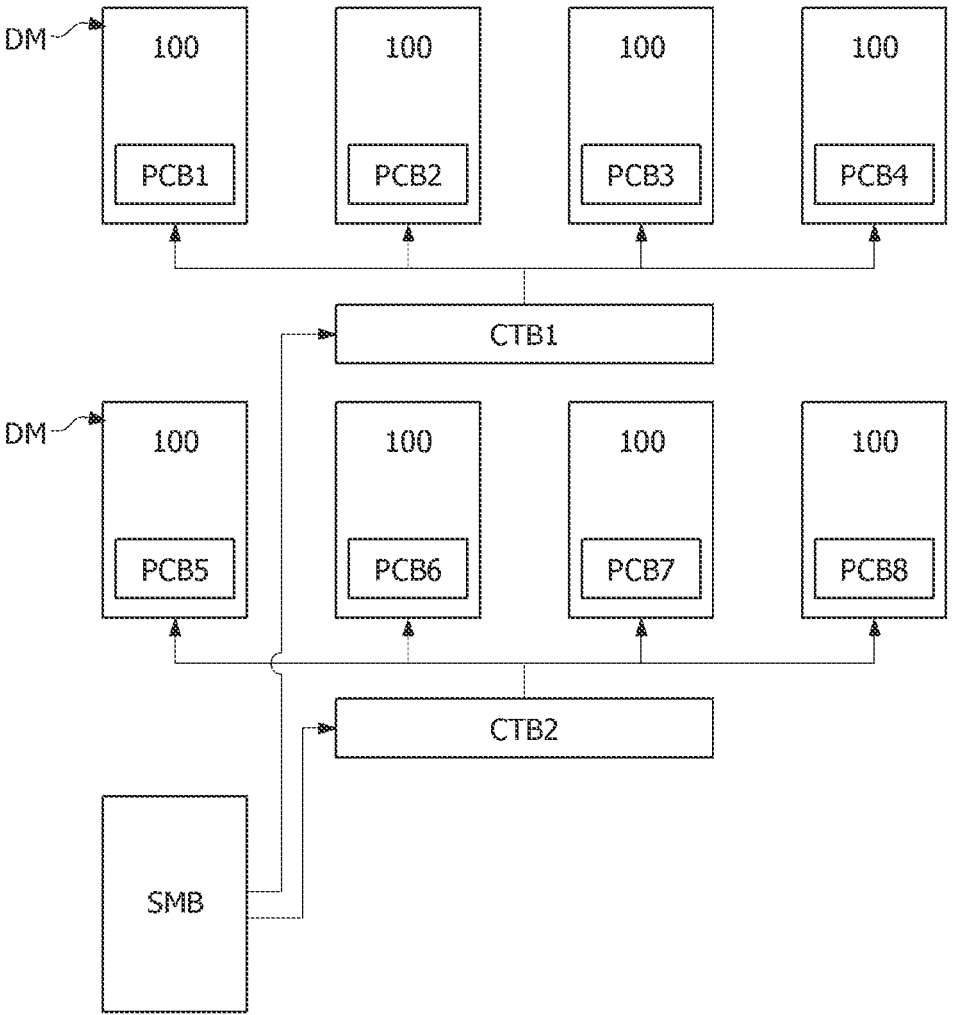
FIG. 4 is a block diagram schematically showing control boards connected to a plurality of printed circuit boards and a system board connected to the control boards of the tiling display device of FIG. 3.

FIG. 1 is a block diagram schematically showing a configuration of a display device 1 according to one or more embodiments of the present disclosure, FIG. 2 is a partial cross-sectional view showing a pad part and a side line disposed on an outermost portion of a display panel 100 according to one or more embodiments of the present disclosure, FIG. 3 is a perspective view showing a tiling display device TD according to one or more embodiments of the present disclosure, and FIG. 4 is a block diagram schematically showing control boards connected to a plurality of printed circuit boards and a system board connected to the control boards.

Referring to FIG. 1, the display device 1 includes a display panel 100, in which a plurality of pixels PX are disposed in a display area AA, and a driving circuit DC for driving the pixels PX.

The display panel 100 may be a panel with a rectangular structure having a length in an X-axis direction, a width in a Y-axis direction, and a thickness in a Z-axis direction. The pixels PX include a plurality of sub-pixels SP for emitting light with different colors. The driving circuit DC includes a data driver DD, a gate driver GD, and a timing controller TC for controlling the gate driver GD and the data driver DD. In the display panel 100, the display area AA on which an input image is displayed may be a screen visible at a front side of the display panel 100. Here, a width and length of the display panel 100 may be set to various design values depending on application fields of the display device. In addition, the X-axis direction may be a longitudinal direction or lateral direction, the Y-axis direction may be a width direction or breadth direction, and the Z-axis direction may be a vertical direction or thickness direction. In addition, the X-axis direction, the Y-axis direction, and the Z-axis direction may be perpendicular to each other, but may also be different directions which are not perpendicular to each other. Therefore, each of the X-axis direction, the Y-axis direction, and the Z-axis direction may be described as any one of a first direction, a second direction, or a third direction. In addition, a surface extending in the X-axis direction and Y-axis direction may indicate a horizontal surface.

An input image is displayed on the sub-pixels SP disposed on the display area AA of the display panel 100. Each of the sub-pixels SP includes a light emitting element and a pixel circuit for driving the light emitting element. The light emitting element may be a light emitting diode (LED) or a micro LED.

A plurality of scan lines SL and a plurality of data lines DL are disposed to intersect each other on the display panel 100. Each of the sub-pixels SP is connected to the scan line SL and the data line DL. Power lines omitted in FIG. 1 may be connected to each of the sub-pixels SP. A non-display area NA may be disposed outside the display area AA in the display panel 100.

The gate driver GD supplies a scan signal to the scan lines SL in response to a gate control signal provided from the timing controller TC. The gate driver GD may be at least disposed on the non-display area NA of the display panel 100 as shown in FIG. 1 or disposed on the display area AA as shown in FIG. 4.

The data driver DD converts image data received from the timing controller TC into reference compensation voltages in response to data control signals provided from the timing controller TC and outputs data voltages. The data voltages output from the data driver DD are supplied to the data lines DL.

The timing controller TC arranges the image data input from the outside and supplies the arranged image data to the data driver DD. The timing controller TC may generate a gate control signal and a data control signal based on timing signals, which are synchronized with the input image signal, such as a dot clock signal, a data enable signal, and horizontal/vertical synchronization signals. The timing controller TC supplies the gate control signal to the gate driver GD and supplies the data control signal to the data driver DD to control operation timings of the gate driver GD and the data driver DD.

Link lines and pad electrodes for transmitting the signals to the sub-pixel SP of the display area AA may be disposed on the non-display area NA. In addition, at least one of a gate driver integrated circuit ("IC") in which circuits of the gate driver GD are integrated and a data driver IC in which circuits of the data driver DD are integrated may be disposed in the non-display area NA. The non-display area NA may be positioned on a rear surface of the display panel 100, that is, a rear surface in which the sub-pixel SP is not present or minimized to a degree at which an image is invisible or not shown in the non-display area NA when the image is displayed on the display panel 100.

The drivers such as the gate driver GD, the data driver DD, and the timing controller TC may be connected to the display panel 100 in various ways. For example, the gate driver GD may be disposed on the non-display area NA in a gate in panel (GIP) method, and disposed between the sub-pixels SP in the display area AA in a gate in active area (GIA) method. For example, the data driver DD and the timing controller TC may be formed on a separate flexible film and printed circuit board (hereinafter referred to as "PCB"), and the data driver DD and the timing controller TC may be electrically connected to the display panel 100 by bonding the flexible film and the PCB to the pad electrodes formed in the non-display area NA of the display panel 100.

Side lines SRL (FIG. 2) for connecting the signal lines on the front surface of the display panel 100 to the pad electrodes on the rear surface of the display panel 100 may be formed on a side surface of an outermost portion of the display panel 100. A method of electrically connecting the front and rear surfaces of the display panel 100 through the side lines can maximally reduce the non-display area NA visible at the front side of the display panel 100. In FIG. 2, "SRL" indicates the side line. When the gate driver GD, the data driver DD, and the timing controller TC are connected to the display panel 100 in the above manner, a substantially bezel-less screen can be implemented.

Referring to FIG. 2, a plurality of pad electrodes PAD1, PAD2 for transmitting various signals to the sub-pixels SP are disposed on the non-display area NA of the display panel 100. For example, a first pad electrode PAD1 for transmitting signals to the sub-pixels SP may be disposed on the non-display area NA on the front surface of the display panel 100. A second pad electrode PAD2 electrically connected to circuit components such as the flexible film and the PCB is disposed on the non-display area NA on the rear surface of the display panel 100. A size of the non-display area NA disposed on an outermost portion of the front surface of the display panel 100 on which the images are displayed can be minimized by arranging only a pad area in which the first pad electrode PAD1 is disposed. In other words, including only sufficient pad area for the first pad electrode PAD1 assists with reducing or minimizing a size of the non-display area on the front surface of the display panel 100.

Various signal lines connected to the sub-pixels SP, for example, the scan line SL, the data line DL, and the like may extend to the non-display area NA and may be electrically connected to the first pad electrode PAD1.

The display panel 100 may include the side line SRL disposed on the side surface of the outermost portion of the display panel 100. The side line SRL may connect the first pad electrode PAD1 disposed on the outermost portion of the front surface of the display panel 100 to the second pad electrode PAD2 disposed on an outermost portion of a rear surface of the display panel 100 across the side surface, which may be an outermost side surface, of the display panel 100. Signals output from the circuit components disposed on the rear surface of the display panel 100 may be transmitted to the sub-pixel SP in the display area AA through the second pad electrode PAD2, the side line SRL, and the first pad electrode PAD1. Therefore, by forming a signal transmission path which passes through the front, side, and rear surfaces of the outermost portion of the display panel 100, it is possible to minimize an area of the non-display area NA on the front surface of the display panel 100.

As shown in FIG. 3, a plurality of display modules DM may be coupled in a plan view and implemented as a large-screen tiling display device TD. Each of the display modules can be implemented as a single display device 1 and implemented as the large-screen tiling display device TD through a combination of the plurality of display modules DM. Each of the display modules DM may include the display panel 100, the driving circuit DC (FIG. 1) of the display panel 100, and the circuit components and module cover members coupled to the rear surface of the display panel 100. In an embodiment, each display module DM includes the display panel 100 and the corresponding circuits and hardware, such as the driving circuit DC, as well as cover members or other structural aspects that comprise the entire display assembly. In some embodiments, each display module DM may include more than one interconnected display panel 100.

Referring to FIG. 3, a large-screen tiling display device TD includes a plurality of display modules DM disposed on an XY plane. Each of the display modules DM includes the display panel 100 for reproducing the input image. When the non-display area NA on the outermost portion of the front surface of each of the display panels 100 is minimized, the tiling display device TD may reproduce a large-screen image without a visible seam which is a boundary between neighboring display panels 100.

In the tiling display device TD, outermost pixels PX of two neighboring display panels 100 are disposed to have a predetermined distance D1. In addition, neighboring pixels PX in the display area AA of the display panel 100 are also disposed to have the distance D1. As a result, the distance D1 between the pixels PX is the same throughout a large-screen display area of the tiling display device TD, and a seam area is invisible. Here, the distance D1 may be referred to as a first distance.

In the tiling display device TD, the plurality of display modules DM may share one timing controller TC. A host system may be connected to a plurality of timing controllers TC to transmit image signals to be reproduced on all display panels 100 which implement the large screen of the tiling display device TD to the timing controllers TC and may synchronize the timing controllers TC.

Referring to FIG. 4, each of the display modules DM may include one display panel 100 and one PCB. A system board SMB is connected to M control boards CTB1 and CTB2 (M is an integer of 2 or more). Each of the control boards CTB1 and CTB2 is connected to N PCBs (N is an integer greater than M).

The first control board CTB1 may be connected to PCBs PCB1 to PCB4 of the first to fourth display modules DM through a flexible film or cable. The second control board CTB2 may be connected to PCBs PCB5 to PCB8 of the fifth to eighth display modules DM through a flexible film or cable. The system board SMB may be connected to the first and second control boards CTB1 and CTB2 through a flexible film or cable.

The system board SMB may be a main board of the host system. The system board SMB includes a user interface port for receiving user inputs, an external interface port connected to external devices, a communication module for delaying various communication protocols, a processor for processing multi-media signals, a central processing unit (CPU), a main power supply unit, and the like. The system board SMB transmits the input image signal and the timing signal to the control boards CTB1 and CTB2. The timing controllers TC mounted on the control boards CTB1 and CTB2 transmit the received image signal to the data driver DD and controls the data driver DD and the gate driver GD based on the timing signal. The driving circuits DD and GD of the N display modules write image data to the corresponding display panel 100 under the control of one timing controller TC.

Figure 5:
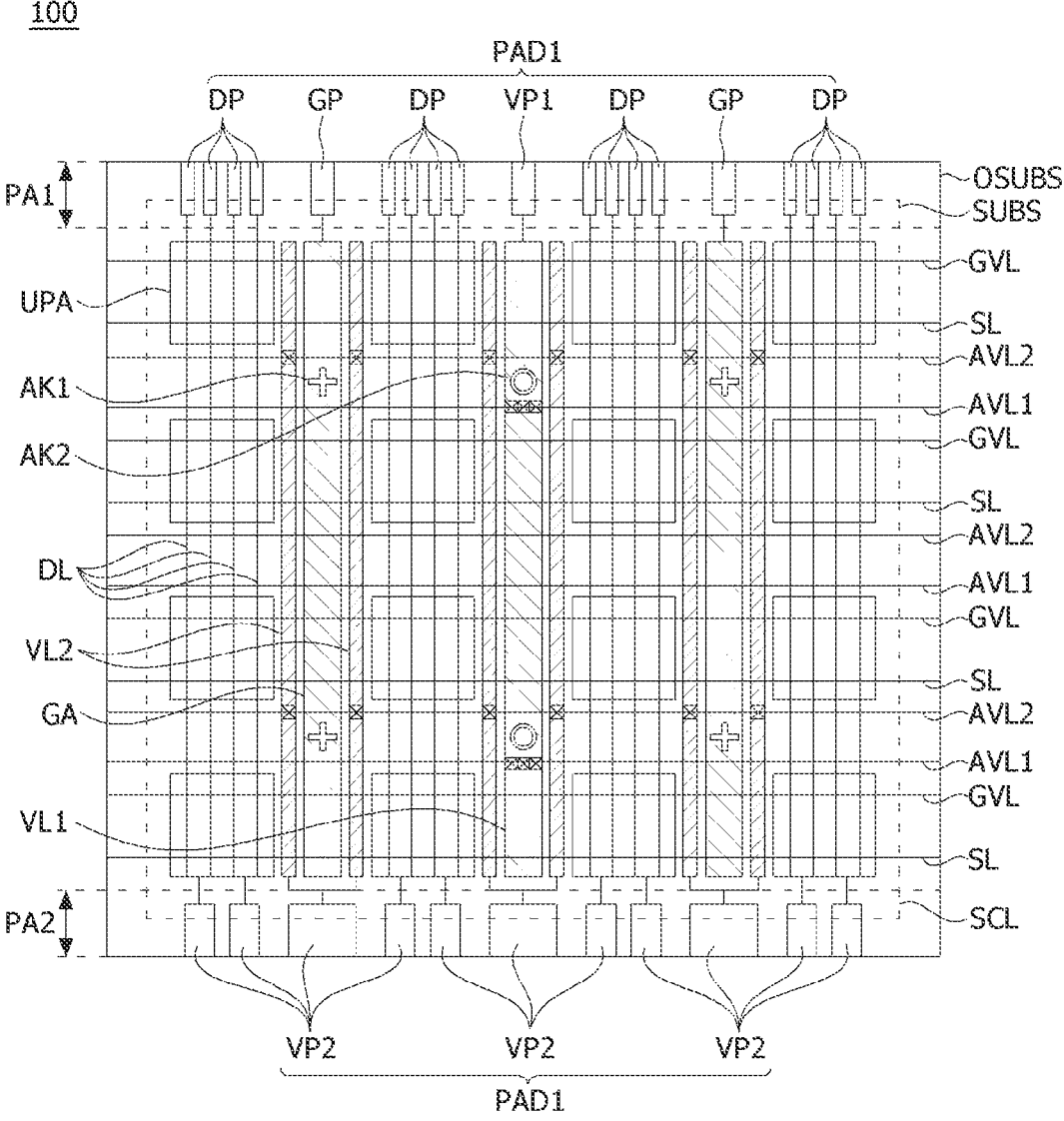
FIG. 5 is a plan view schematically showing a planar structure of the display panel of FIG. 1.
Figure 6:
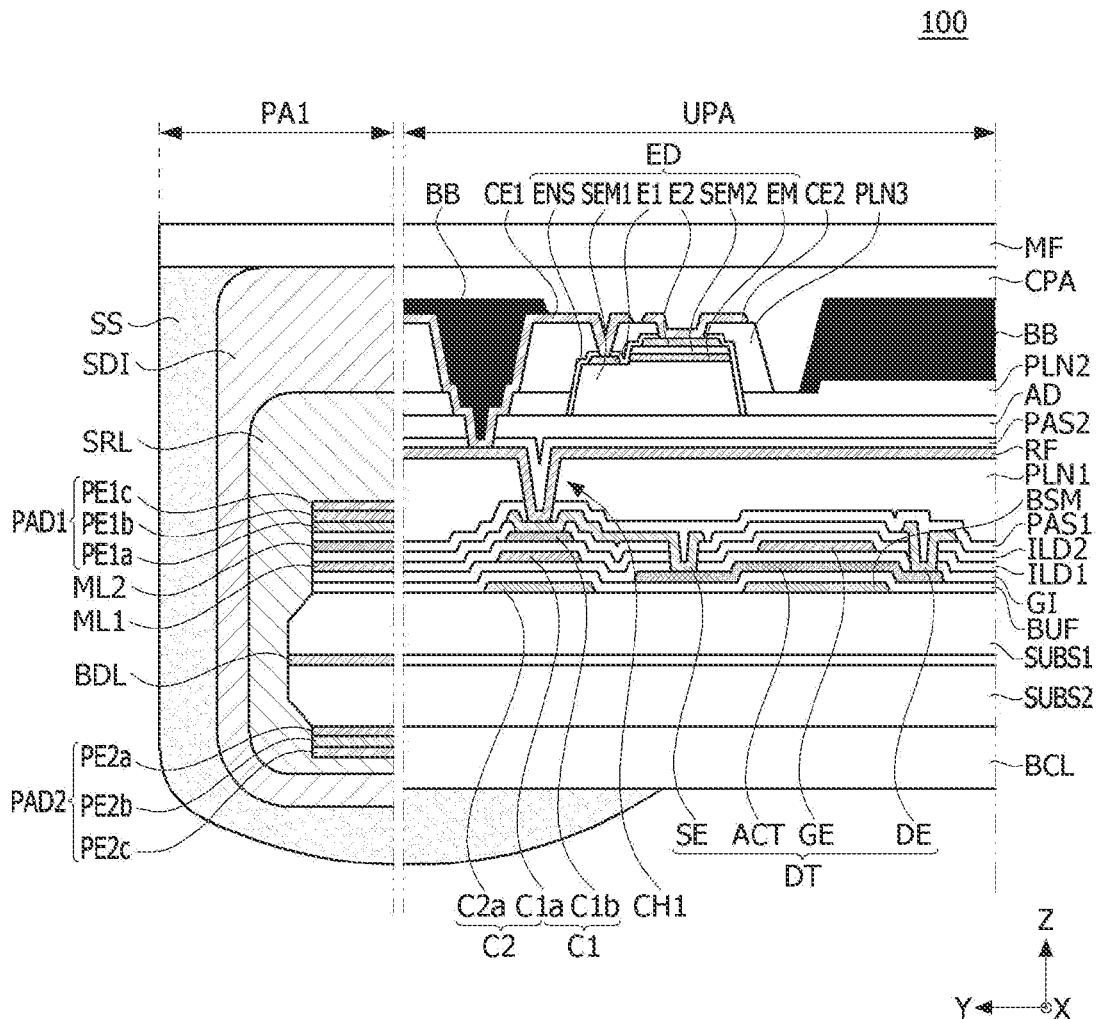
FIG. 6 is a schematic cross-sectional view showing a structure of the display panel of FIG. 1.

FIG. 5 is a plan view schematically showing a planar structure of the display panel 100 according to one or more embodiments of the present disclosure. FIG. 6 is a cross-sectional view showing a cross-sectional structure of the display panel 100 according to one or more embodiments of the present disclosure.

Referring to FIG. 5 and FIG. 6, the display panel 100 includes a substrate SUBS on which a pixel array and the circuits of the gate driver GD are disposed.

The substrate SUBS may be an insulating substrate for supporting components disposed on an upper portion of the display device. As shown in FIG. 6, the substrate SUBS may have a structure in which first and second substrates SUBS1 and SUBS2 are stacked. Each of the first and second substrates SUBS1 and SUBS2 may be manufactured as glass, polymer resin, or plastic substrate. Each of the first and second substrates SUBS1 and SUBS2 may be manufactured as a flexible substrate, but is not limited thereto.

On one surface (or a front surface) of the substrate SUBS, the display area AA may include a plurality of pixel areas UPA, a plurality of gate driving areas GA, and a plurality of pad areas PA1 and PA2. One or more pixels PX may be disposed on each of the pixel areas UPA. The pixel areas UPA may be disposed along a plurality of row lines and a plurality of column lines. Each of the pixels PX includes a plurality of sub-pixels SP for emitting light with different colors. Each of the sub-pixels SP may include a light emitting element and a pixel circuit and emit light independently. The sub-pixels SP may include a red sub-pixel, a blue sub-pixel, and a green sub-pixel, but is not limited thereto.

The plurality of gate driving areas GA include the circuits of the gate driver GD. The gate driving area GA may be formed in row and/or column directions between the plurality of pixel areas UPA. The gate driver GD formed in the gate driving area GA may provide a scan signal to the plurality of scan lines SL.

The first pad area PA1 includes a plurality of first pad electrodes PAD1 disposed on a front surface of an outermost portion of one side (or an upper side) of the display panel 100. The first pad electrodes PAD1 may transmit various signals to various lines extending in the column direction in the display area AA. The first pad electrodes PAD1 includes data pads DP connected to the data lines DL and for transmitting the data voltage from the data driver DD to the data lines DL, and gate pads GP connected to the gate driver GD and for transmitting a clock signal, a start signal, a gate low voltage, a gate high voltage, and the like for driving the gate driver GD to the gate driver GD. The clock signal, start signal, gate low voltage, gate high voltage, and the like for driving the gate driver GD may be generated from the timing controller TC and applied to the gate pads GP via a level shifter and the PCB. The first pad electrodes PAD1 may include a plurality of power supply lines to which a DC voltage (or a constant voltage) is applied.

The second pad area PA2 includes a plurality of first pad electrodes PAD1 disposed on a front surface of an outermost portion of the other side (or a lower side) of the display panel 100. The second pad area PA2 may include a plurality of low-potential power pads VP2.

The DC voltage applied to the power lines may be output from the power circuit omitted in the drawing and applied to the pads VP1 and VP2 connected to the power lines through the PCB. The power circuit may be a DC-DC converter disposed on the PCB or control boards CTB1 and CTB2 disposed on the rear surface of the display panel 100 to convert a DC input voltage from a main power supply unit into a direct voltage suitable for driving the display panel 100.

The power pads VP1 and VP2 connected to the power lines may include a plurality of high-potential power pad VP1 disposed on the first pad area PA1 to transmit a high-potential power voltage to a high-potential power line VL1, and a plurality of low-potential power pads VP2 disposed on the second pad area PA2 to transmit a low-potential power voltage to a low-potential power line VL2.

The data pad DP connected to each of the data lines DL may have a relatively smaller width, and the power pads VP1 and VP2 and the gate pads GP may have relatively greater widths. The low-potential power pads VP2 may have greater widths than the high-potential power pads VP1. The widths of the pads DP, GP, VP1, and VP2 are not limited to those of FIG. 5.

In order to minimize the outermost non-display area NA of the display panel 100, after the pixel array, lines, and pads are formed on a front surface of the substrate SUBS of the display panel 100, the substrate SUBS is cut along a scribing line SCL. Therefore, the substrate SUBS may be provided by removing a portion OSUBS outside the scribing. After the scribing process, rough edges on a side surface of an outermost portion of the substrate SUBS may be ground or laser-trimmed. As described above, short pad electrodes PAD1 and PAD2 remain on the front surface of the outermost portion of the substrate SUBS with the reduced size. The location of the scribing line SCL may generally be selected. In an embodiment, the scribing line SCL is selected to minimize the size of the non-display area NA as much as possible while also retaining a sufficient area on the pad electrodes PAD1 and PAD2 to establish the electrical connections described herein. The scribing line SCL may also be on all sides of the display panel 100, again to reduce the size of the non-display area NA, although the same is not necessarily required.

The data lines DL may extend in the column direction (Y-axis direction) on the first substrate SUBS and overlap the pixel area UPA. The data lines DL supply data voltages to the pixel circuit of each sub-pixel SP. The scan lines SL may extend in the row direction (X-axis direction) on the substrate SUBS of the display panel 100 and overlap the pixel area UPA and the gate driving area GA. The scan lines SL may supply the scan signal from the gate driver GD to the pixel circuit of each of the sub-pixels SP across the pixel area UPA and the gate driving area GA.

The high-potential power lines VL1 extend in the column direction (Y-axis direction), and at least one of the high-potential power lines VL1 is connected to an auxiliary high-potential power line AVL1 extending in the row direction (X-axis direction) in a mesh structure. The auxiliary high-potential power lines AVL1 are connected to the sub-pixels SP disposed in the row direction (X direction). Therefore, the high-potential power voltage applied to the high-potential power lines VL1 may be transmitted to the sub-pixels SP through the auxiliary high-potential power lines AVL1.

The low-potential power lines VL2 extend in the column direction (Y-axis direction), and at least one of the low-potential power lines VL2 is connected to an auxiliary low-potential power line AVL2 extending in the row direction (X-axis direction) in a mesh structure. The auxiliary low-potential power lines AVL2 are connected to the sub-pixels SP disposed in the row direction (X-axis direction). Therefore, the sub-pixels SP are connected to the auxiliary high-potential power lines AVL1 to which the low-potential power voltages are applied.

Due to the mesh structure of the power lines, resistances of the power lines can be reduced, thereby reducing a voltage drop of the high-potential power voltage and a deviation of the power voltage in the display area AA.

A plurality of gate driving lines GVL extending in the row direction are disposed on a first substrate SUBS1 of the display panel 100. The plurality of gate driving lines GVL transmit signals necessary for driving the gate driver GD disposed on the gate driving area GA, such as a clock signal, a start signal, a gate high voltage, and a gate low voltage.

The substrate SUBS of the display panel 100 may include one or more alignment keys AK1 and AK2 disposed between the pixel areas UPA. The alignment keys AK1 and AK2 may be used for alignment in the manufacturing process of the display panel 100. The first alignment key AK1 may be disposed on the gate driving area GA. The first alignment key AK1 may be used to check an alignment position of each of the light emitting elements. The first alignment key AK1 may be formed in a cross pattern, but is not limited thereto. The second alignment key AK2 may overlap the high-potential power line VL1. The high-potential power line VL1 includes a hole formed at a position overlapping the second alignment key AK2 to distinguish the second alignment key AK2 from the high-potential power line VL1. The second alignment key AK2 may be used to align the display panel 100 with a donor substrate. The donor substrate is an intermediate medium for mounting the light emitting element on the substrate SUBS of the display panel 100. A plurality of light emitting elements manufactured on a semiconductor wafer may be transported after being attached to the donor substrate, and the light emitting elements attached on the donor substrate may be transferred onto the substrate SUBS. The second alignment key AK2 may be formed in a circular or ring pattern, but is not limited thereto.

Turning to FIG. 6, a pixel circuit for driving a light emitting element ED is disposed in each of the plurality of sub-pixels SP on the first substrate SUBS1. The pixel circuit may include a plurality of thin film transistors and one or more capacitors. Although a driving transistor DT, a first capacitor C1, and a second capacitor C2 used for the pixel circuit are shown for convenience of description, the display panel 100 may further include other circuit elements in any selected arrangement.

A pattern of a first metal layer may be disposed on the first substrate SUBS1. The pattern of the first metal layer may include a light blocking layer BSM. The light blocking layer BSM can minimize a leakage current by blocking light incident on an active layer ACT of the driving transistor DT. The light blocking layer BSM may be made of an opaque conductive material, for example, a metal such as copper (Cu), aluminum (Al), molybdenum (Mo), nickel (Ni), titanium (Ti), or chromium (Cr), made of an alloy of these metals or formed as a plurality of metal layers.

A buffer layer BUF may be disposed on the light blocking layer BSM. The buffer layer BUF may block moisture or impurities from being introduced through the first substrate SUBS1. The buffer layer BUF may be made of silicon oxide (SiO$_x$), silicon nitride (SiN$_x$), or a plurality of insulating layers.

The driving transistor DT including the active layer ACT, a gate electrode GE, a source electrode SE, and a drain electrode DE may be disposed on the buffer layer BUF.

The active layer ACT may be made of a semiconductor material such as oxide semiconductor, amorphous silicon, or polysilicon, but is not limited thereto. A gate insulating layer GI electrically insulates the active layer ACT from the gate electrode GE of the driving transistor DT. The gate insulating layer GI may be made of silicon oxide (SiO$_x$), silicon nitride (SiN$_x$), or a plurality of insulating layers.

A pattern of the second metal layer may be disposed on the gate insulating layer GI. The pattern of the second metal layer may include the gate electrode GE of the driving transistor DT. The second metal layer may be made of copper (Cu), aluminum (Al), molybdenum (Mo), nickel (Ni), titanium (Ti), chromium (Cr), or a plurality of metal layers.

A first interlayer insulating layer ILD1 and a second interlayer insulating layer ILD2 are disposed on the gate electrode GE. The first interlayer insulating layer ILD1 and the second interlayer insulating layer ILD2 have contact holes for connecting each of the source electrode SE and the drain electrode DE of the driving transistor DT to the active layer ACT. Each of the first interlayer insulating layer ILD1 and the second interlayer insulating layer ILD2 may be made of silicon oxide (SiO$_x$), silicon nitride (SiN$_x$), or a plurality of insulating layers.

A pattern of a third metal layer may be disposed on the second interlayer insulating layer ILD2. The pattern of the third metal layer may include the source electrode SE and the drain electrode DE connected to the active layer ACT through the contact holes overlapping the active layer ACT and passing through the interlayer insulating layers ILD1 and ILD2. The source electrode SE may be connected to the capacitors C1 and C2 and a first electrode E1 of the light emitting element ED. The third metal layer may be made of copper (Cu), aluminum (Al), molybdenum (Mo), nickel (Ni), titanium (Ti), chromium (Cr), or a plurality of metal layers.

The first capacitor C1 includes a first capacitor electrode C1$a$ and a second capacitor electrode C1$b$. The first capacitor electrode C1$a$ may be formed in a pattern of the second metal layer disposed on the gate insulating layer GI. The second capacitor electrode C1$b$ is formed in a pattern of a fourth metal layer disposed on the first interlayer insulating layer ILD1 and overlaps the first capacitor electrode C1$a$ with the first interlayer insulating layer ILD1 interposed therebetween. The second capacitor electrode C1$b$ may be connected to the source electrode SE of the driving transistor DT. The fourth metal layer may be made of copper (Cu), aluminum (Al), molybdenum (Mo), nickel (Ni), titanium (Ti), chromium (Cr), or a plurality of metal layers.

The second capacitor C2 includes a third capacitor electrode C2$a$ overlapping the first capacitor electrode C1$a$ with the buffer layer BUF and the gate insulating layer GI interposed therebetween. The third capacitor electrode C2$a$ may be formed in the pattern of the first metal layer disposed on the first substrate SUBS1.

Since the second capacitor C2 is electrically connected between the source electrode SE of the driving transistor DT and the light emitting element ED to increase a capacitance of the light emitting element ED, the brightness can be increased when the light emitting element ED emits light.

A first passivation layer PAS1 covers the pattern of the third metal layer and the second interlayer insulating layer ILD2 to cover the pattern of the third metal layer. The first passivation layer PAS1 may be made of silicon oxide (SiO$_x$), silicon nitride (SiN$_x$), or a plurality of insulating layers.

A first planarization layer PLN1 is disposed on the first passivation layer PAS1. The first planarization layer PLN1 covers the first passivation layer PAS1 and planarizes a surface on which the light emitting element is disposed. The first planarization layer PLN1 may be a thick single organic insulating layer or a plurality of organic insulating layers made of benzocyclobutene or an acryl-based organic material.

A pattern of a fifth metal layer may be disposed on the first planarization layer PLN1. The pattern of the fifth metal layer may include a reflective layer RF. The reflective layer RF can increase light efficiency by reflecting light from the light emitting element ED toward the front surface of the display panel 100 and can be used as an electrode connecting the light emitting element ED to the pixel circuit or power line. The reflective layer RF may be electrically connected to the source electrode SE of the driving transistor DT and the first capacitor C1 through a contact hole CHI passing through the first planarization layer PLN1 and the first passivation layer PAS1. In addition, the reflective layer RF may be electrically connected to the first electrode E1 of the light emitting element ED through a first connection electrode CE1 or may electrically connect a second electrode E2 of the light emitting element ED to the high-potential power line VL1. The fifth metal layer may be made of silver (Ag), aluminum (Al), molybdenum (Mo), titanium (Ti), a transparent electrode material such as indium tin oxide (ITO), or a plurality of metal layers.

The second passivation layer PAS2 covers the pattern of the fifth metal layer and the first planarization layer PLN1. The second passivation layer PAS2 may be made of silicon oxide (SiO$_x$), silicon nitride (SiN$_x$), or a plurality of insulating layers.

An adhesive layer AD may be disposed on the second passivation layer PAS2 to fix the light emitting element ED. The adhesive layer AD may be made of a photocurable resin which may be cured by light. The adhesive layer AD may be made of an acrylic-based material containing a photosensitive agent, but is not limited thereto. The adhesive layer AD may be formed on the entire surface of the first substrate SUBS1 excluding the pad areas PA1 and PA2 in which the first pad electrode PAD1 is disposed.

The light emitting element ED of each of the sub-pixels SP may be disposed on the adhesive layer AD. The light emitting elements ED may emit light by a current from the driving transistor DT. The light emitting elements ED may include a red light emitting element ED, a green light emitting element ED, and a blue light emitting element ED. The light emitting element ED may be a LED or micro LED.

Each of the light emitting elements ED includes a first semiconductor pattern SEM1, a light emitting layer EM, a second semiconductor pattern SEM2, the first electrode E1, and the second electrode E2.

The first semiconductor pattern SEM1 is disposed on the adhesive layer AD, and the second semiconductor pattern SEM2 is disposed on the first semiconductor pattern SEM1. The first semiconductor pattern SEM1 and the second semiconductor pattern SEM2 may be formed as semiconductor patterns obtained by doping n-type and p-type impurities into a semiconductor material. For example, each of the first semiconductor pattern SEM1 and the second semiconductor pattern SEM2 may be a layer obtained by doping the n-type or p-type impurities into a material such as gallium nitride (GaN), indium aluminum phosphide (InAlP), and gallium arsenide (GaAs). In addition, although the p-type impurity may be magnesium, zinc (Zn), beryllium (Be), or the like, and the n-type impurity may be silicon (Si), germanium, tin (Sn), or the like, the present disclosure are not limited thereto.

The light emitting layer EM is disposed between the first semiconductor pattern SEM1 and the second semiconductor pattern SEM2. The light emitting layer EM may receive holes and electrons from the first semiconductor pattern SEM1 and the second semiconductor pattern SEM2 and emit light. The light emitting layer EM may be formed in a single-layer or multi-quantum well (MQW) structure and made of, for example, indium gallium nitride (InGaN) or gallium nitride (GaN).

The first electrode E1 is disposed on the first semiconductor pattern SEM1. The first electrode E1 electrically connects the driving transistor DT to the first semiconductor pattern SEM1. The first semiconductor pattern SEM1 may be formed of a semiconductor layer doped with n-type impurities. The first electrode E1 may be an anode of the light emitting element ED disposed on the first semiconductor pattern SEM1 and electrically connected to the driving transistor DT and the capacitors C1 and C2 via the reflective layer RF. The first electrode E1 may be disposed on an upper surface of the first semiconductor pattern SEM1. The first electrode E1 may be made of a conductive material, for example, a transparent conductive material such as ITO or indium zinc oxide (IZO), an opaque conductive material such as titanium (Ti), gold (Au), silver (Ag), copper (Cu), an alloy thereof, or the like.

The second electrode E2 is disposed on the second semiconductor pattern SEM2. The second electrode E2 electrically connects the high-potential power line VL1 to the second semiconductor layer SEM2. The second semiconductor layer SEM2 may be formed as a semiconductor layer doped with p-type impurities. The second electrode E2 may be a cathode of the light emitting element ED. The second electrode E2 may be made of a conductive material, for example, a transparent conductive material such as ITO or IZO, an opaque conductive material such as titanium (Ti), gold (Au), silver (Ag), copper (Cu), an alloy thereof, or the like.

The light emitting element ED may include an encapsulation layer ENS. The encapsulation layer ENS covers the semiconductor patterns SEM1 and SEM2 and the electrodes E1 and E2 and protects the light emitting element ED. The encapsulation layer ENS and a third planarization layer PLN3 include contact holes exposing the first electrode E1 and the second electrode E2. The first connection electrode CE1 is connected to the reflective layer RF through a first contact hole passing through the encapsulation layer ENS and the third planarization layer PLN3. The second connection electrode CE2 is connected to the second electrode E2 through a second contact hole passing through the encapsulation layer ENS and the third planarization layer PLN3. Meanwhile, a portion of a side surface of the first semiconductor pattern SEM1 may be exposed without encapsulation layer ENS.

The second planarization layer PLN2 and the third planarization layer PLN3 may cover the adhesive layer AD and the light emitting element ED. The second planarization layer PLN2 comes into contact with a lower end of a side surface of the light emitting element ED and fixes the light emitting element ED. The third planarization layer PLN3 covers the light emitting element ED above the second planarization layer PLN2. The third planarization layer PLN3 includes contact holes exposing the first electrode E1 and the second electrode E2 of the light emitting element ED. The second planarization layer PLN2 and the third planarization layer PLN3 may be made of a single layer or multiple layers formed of organic insulating materials, such as a photoresist or acryl-based organic material.

A pattern of a sixth metal layer may be disposed on the third planarization layer PLN3. The sixth metal layer may include the first connection electrode CE1 and the second connection electrode CE2. The first connection electrode CE1 electrically connects the first electrode E1 of the light emitting element ED to the reflective layer RF. The first connection electrode CE1 may be connected to the first electrode E1 of the light emitting element ED through a contact hole passing through the insulating layers PLN3 and ENS and connected to the reflective layer RF through a contact hole passing through the insulating layers PAS2, AD, PLN2, and PLN3.

The second connection electrode CE2 is connected to the second electrode E2 of the light emitting element ED through the contact hole passing through the insulating layers PLN3 and ENS. The second connection electrode CE2 may be connected to the low-potential power line VL2.

According to one or more embodiments, although it is shown that the light emitting element ED has a horizontal structure in which the connection electrodes CE1 and CE2 are connected to the upper surfaces of the first semiconductor pattern SEM1 and the second semiconductor pattern SEM2, the present disclosure is not necessarily limited thereto. For example, the light emitting element ED may have a vertical structure in which the first connection electrode CE1 is disposed under the first semiconductor pattern SEM1.

A bank pattern BB may be disposed on the second planarization layer PLN2. The bank pattern BB may be spaced a predetermined distance from the light emitting element ED. The bank pattern BB may cover a portion of the first connection electrode CE1 which is present in the contact hole passing through the insulating layers PLN2 and PLN3. The bank pattern BB can reduce color mixing between the sub-pixels SP by preventing optical crosstalk between the sub-pixels SP. To this end, the bank pattern BB may be made of a black resin, but is not limited thereto.

A first protective layer CPA may cover the patterns CE1 and CE2 of the sixth metal layer, the bank pattern BB, the second planarization layer PLN2, and the third planarization layer PLN3. The first protective layer CPA may be formed of a single insulating layer, a plurality of insulating layers, or the like made of a translucent epoxy, silicon oxide (SiO$_x$), or silicon nitride (SiN$_x$).

Each of the first pad electrodes PAD1 disposed on the pad areas PA1 and PA2 of the first substrate SUBS1 may have a structure of a plurality of metal layers. For example, each of the first pad electrodes PAD1 may include a first pad metal layer PE1a, a second pad metal layer PE1b, and a third pad metal layer PE1c stacked on the front surface of the outermost portion of the first substrate SUBS1.

The pattern of the third metal layer disposed on the second interlayer insulating layer ILD2 may further include the first pad metal layer PE1a. The first pad metal layer PE1a may be made of the same metal as that of the source electrode SE and the drain electrode DE of the driving transistor DT, such as copper (Cu), aluminum (Al), molybdenum (Mo), nickel (Ni), titanium (Ti), chromium (Cr), or a plurality of metal layers.

The pattern of the fifth metal layer disposed on the first planarization layer PLN1 may further include the second pad metal layer PE1b. The second pad metal layer PE1b may be made of the same metal as that of the reflective layer RF, such as silver (Ag), aluminum (Al), molybdenum (Mo), or a plurality of metal layers.

The pattern of the sixth metal layer disposed on the third planarization layer PLN3 may further include the third pad metal layer PE1c. The third pad metal layer PE1c may be made of the same conductive material as those of the first connection electrode CE1 and the second connection electrode CE2, for example, a transparent conductive material such as ITO or IZO, or a plurality of metal layers or the like.

A first metal layer ML1, a second metal layer ML2, and a plurality of insulating layers may be disposed under the first pad electrodes PAD1. A step difference of the first pad electrode PAD1 may be adjusted by arranging the first metal layer ML1, the second metal layer ML2, and the plurality of insulating layers under the first pad electrode PAD1. For example, the buffer layer BUF, the gate insulating layer GI, the first metal layer ML1, the first interlayer insulating layer ILD1, and the second interlayer insulating layer ILD2 may be sequentially disposed between the first pad electrode PAD1 and the first substrate SUBS1. The pattern of the second metal layer disposed on the gate insulating layer GI may include the first metal layer ML1. The pattern of the fourth metal layer disposed on the first interlayer insulating layer ILD1 may include the second metal layer ML2. The plurality of insulating layers and metal layers ML2 and ML3 under the first pad electrodes PAD1 are not limited to those of FIG. 6.

The second substrate SUBS2 may be disposed on the rear surface of the first substrate SUBS1. A bonding layer BDL is disposed between the first substrate SUBS1 and the second substrate SUBS2. The bonding layer BDL is cured through various curing methods to bond the first substrate SUBS1 and the second substrate SUBS2. The bonding layer BDL may be disposed only on a partial area between the first substrate SUBS1 and the second substrate SUBS2 or disposed on the entire area. The first substrate SUBS1 and the second substrate SUBS2 may be scribed and ground at the same time so that the side surfaces of the first substrate SUBS1 and the second substrate SUBS2 may be formed as side surfaces without any step.

A plurality of second pad electrodes PAD2 may be disposed on a rear surface of an outermost portion of the second substrate SUBS2. The second pad electrodes PAD2 are electrically connected to the side lines SRL and the first pad electrode PAD1 to transmit signals from circuit components disposed on the rear surface of the second substrate SUBS2 to the sub-pixels SP disposed on the upper surface of the first substrate SUBS1.

Each of the second pad electrodes PAD2 may have a structure of a plurality of metal layers. For example, each of the second pad electrodes PAD2 may include a first pad metal layer PE2a, a second pad metal layer PE2b, and a third pad metal layer PE2c stacked on the rear surface of the outermost portion of the second substrate SUBS2. Each of the first and second pad metal layers PE2a and PE2b may be made of copper (Cu), aluminum (Al), molybdenum (Mo), nickel (Ni), titanium (Ti), chromium (Cr), or formed of a plurality of metal layers. The third pad metal layer PE2c may be made of a transparent conductive material such as ITO or IZO.

A second protective layer BCL may be disposed on the rear surface of the second substrate SUBS2. The second protective layer BCL may cover various lines except for the second pad electrodes PAD2 on the rear surface of the second substrate SUBS2. The second protective layer BCL may be made of an organic insulating material, for example, benzocyclobutene or an acryl-based organic insulating material.

Circuit components such as a plurality of flexible films and a PCB may be disposed on the rear surface side of the second substrate SUBS2. Output terminals of the flexible film are electrically connected to the second pad electrode PAD2, and input terminals of the flexible film are electrically connected to output terminals of the PCB. Therefore, the signals or voltages output from the PCB may be transmitted to the sub-pixels SP disposed on the front surface of the first substrate SUBS1 through the flexible film, the second pad electrode PAD2, the side line SRL, the plurality of first pad electrodes PAD1, and the lines connected to the first pad electrode PAD1

The side lines SRL electrically connect the first pad electrodes PAD1 to the second pad electrodes PAD2 across the side surfaces of the first substrate SUBS1 and the second substrate SUBS2. The side lines SRL may be formed on the side surfaces of the substrates SUBS1 and SUBS2 in a pad printing method using conductive ink, for example, conductive ink containing silver (Ag), copper (Cu), molybdenum (Mo), chromium (Cr), or the like.

A side insulating layer SDI may cover the side lines SRL formed on the upper, side, and rear surfaces of the outermost portions of the bonded substrates SUBS1 and SUBS2. When the side lines SRL are made of a metal, external light may be reflected from the side lines SRL, or light emitted from the light emitting element ED may be reflected from the side lines SRL to be visible to the user. In order to suppress the degradation in image quality due to reflected light, the side insulating layer SDI may include a black material for absorbing external light. For example, the side insulating layer SDI may be formed on the outermost portions of the substrates SUBS1 and SUBS2 with black ink which can be applied in a printing method.

A protection layer SS may cover the side insulating layer SDI to protect the display panel 100 from an external impact, moisture, oxygen, or the like. For example, the protection layer SS may be made of a black ink, polyimide (PI), polyurethane, epoxy, or acryl-based insulating material or the like. The concept of the protection layer SS may include the side insulating layer SDI. In other words, the protection layer SS and the side insulating layer SDI may be formed as one layer.

A cover film MF may cover a front surface of the first display panel 100. The cover film MF may be one or more among various functional films, such as an anti-shattering film, an anti-glare film, an anti-reflecting film, a low-reflecting film, an OLED transmittance controllable film, a color difference compensation film, and a polarizer. The anti-shattering film prevents pieces or particles of the substrate from shattering when the display panel 100 is broken. The cover film MF may be removed by being cut together with an outer portion of the protection layer SS along a cutting line overlapping the protection layer SS after the protection layer SS is widely bonded to the front surface of the first substrate SUBS1. As a result, the side surfaces exposed at the outermost portions of the cover film MF and the protection layer SS may form the same side surface without any step.

Figure 7:
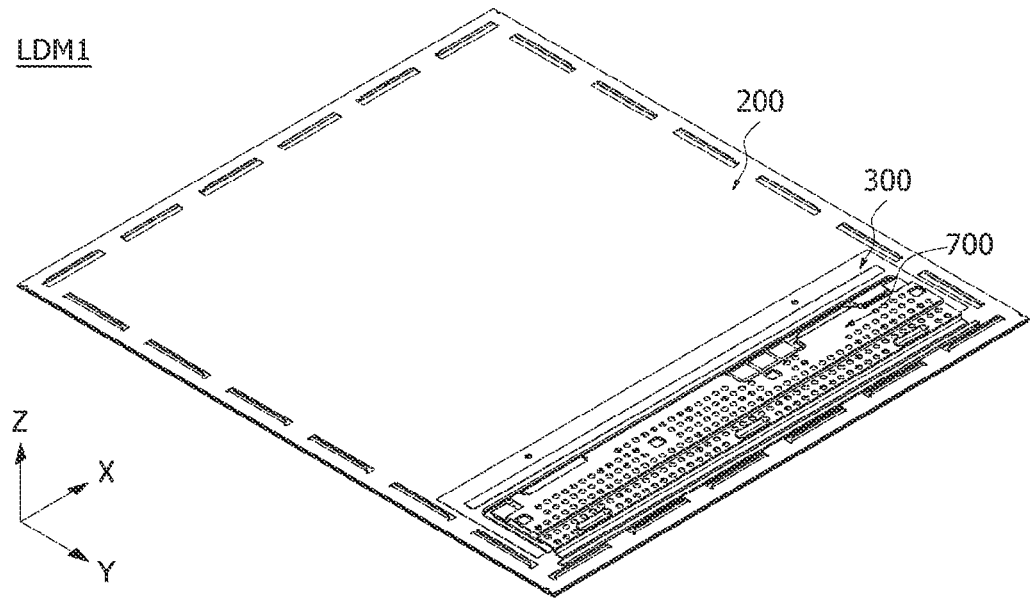
FIG. 7 is a perspective view showing a display module including the display panel of FIG. 1.
Figure 8:
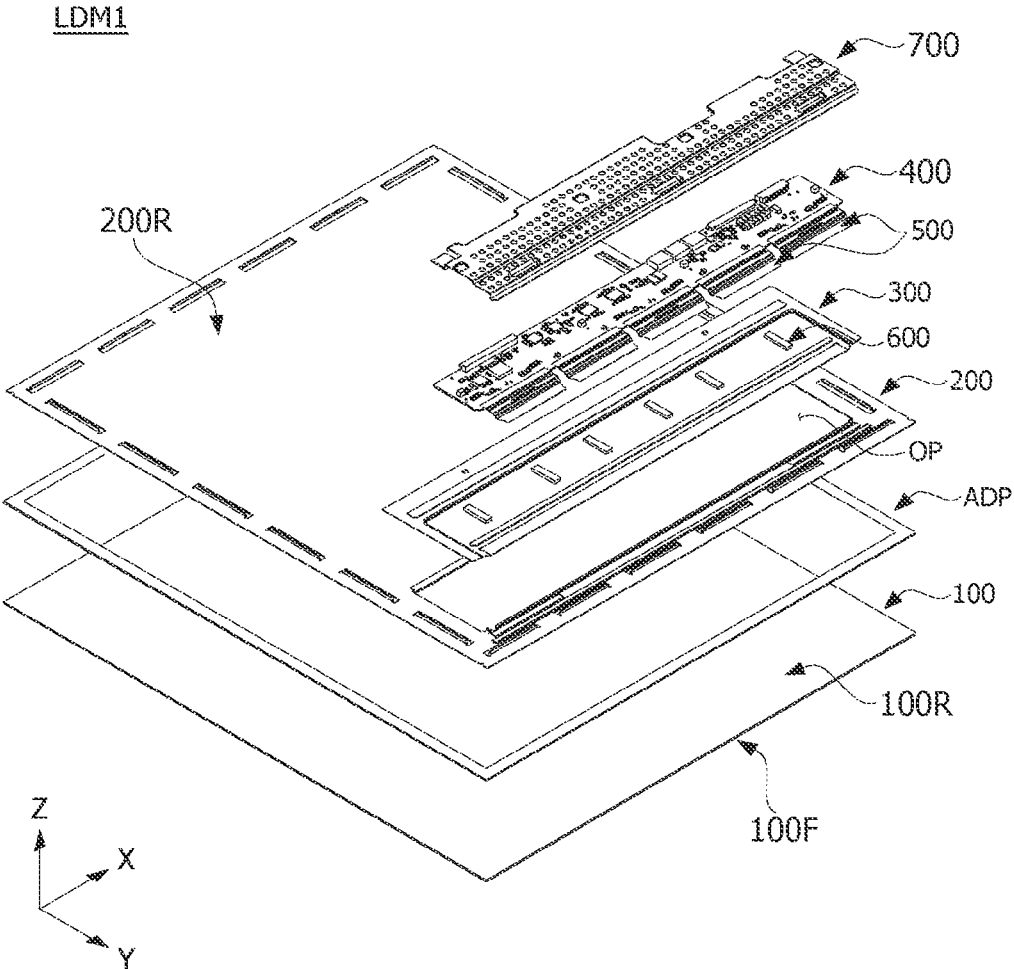
FIG. 8 is an exploded perspective view of the display module of FIG. 7.

Referring to FIGS. 7 and 8, a display module LDM1 according to an embodiment may include the display panel 100 including a front surface 100F on which images are implemented and a rear surface 100R which is a surface opposite to the front surface 100F, a cover bottom 200 (which may also be referred to herein as a bottom cover 200) disposed on the rear surface of the display panel 100, a plate bottom 300 (which may also be referred to herein as a bottom plate 300) disposed in contact with the rear surface 100R of the display panel 100 in an opening OP through the cover bottom 200, a circuit board 400, at least one flexible film 500 connecting the display panel 100 to the circuit board 400 through the opening OP, and at least one rib 600 disposed between the plate bottom 300 and the circuit board 400. In addition, the display module LDM1 may include a cover shield 700 for covering the circuit board 400.

The display module LDM1 may further include an adhesive member ADP for coupling the display panel 100 to the cover bottom 200. The adhesive member ADP may be disposed between the cover bottom 200 and the display panel 100 along an edge of the display module. The adhesive member ADP may be a foam tape with double-sided adhesiveness, but is not limited thereto.

Figure 9:
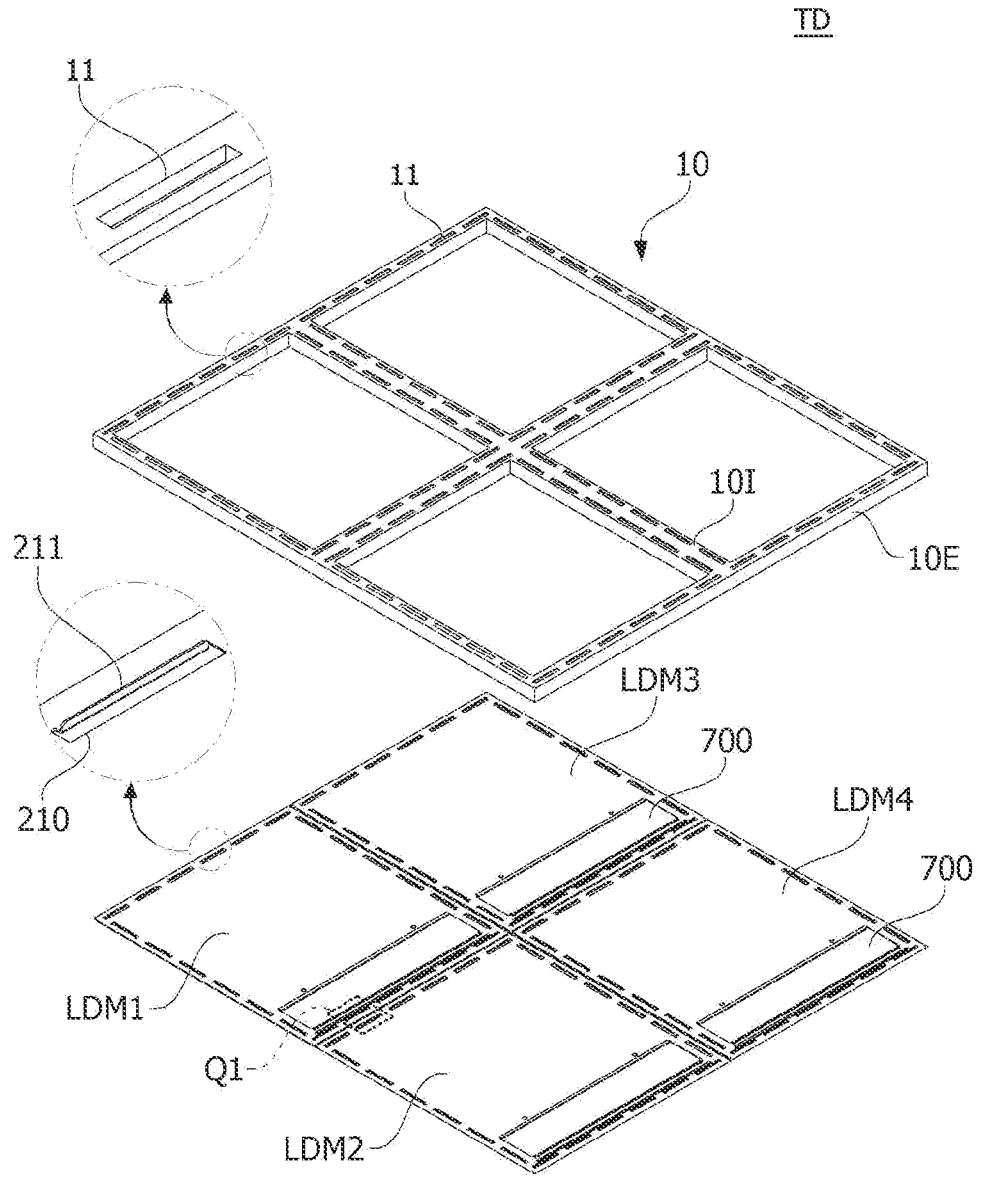
FIG. 9 is a perspective view showing a plurality of display modules of FIG. 7 fixed to a frame.
Figure 10:
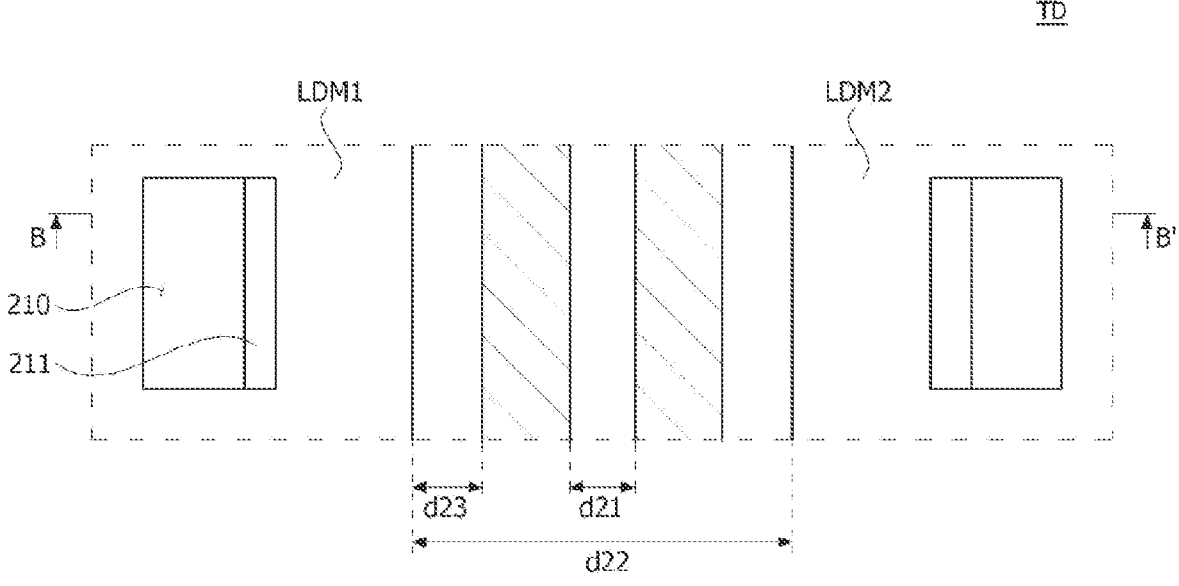
FIG. 10 is an enlarged view of portion Q1 in FIG. 9.
Figure 11:
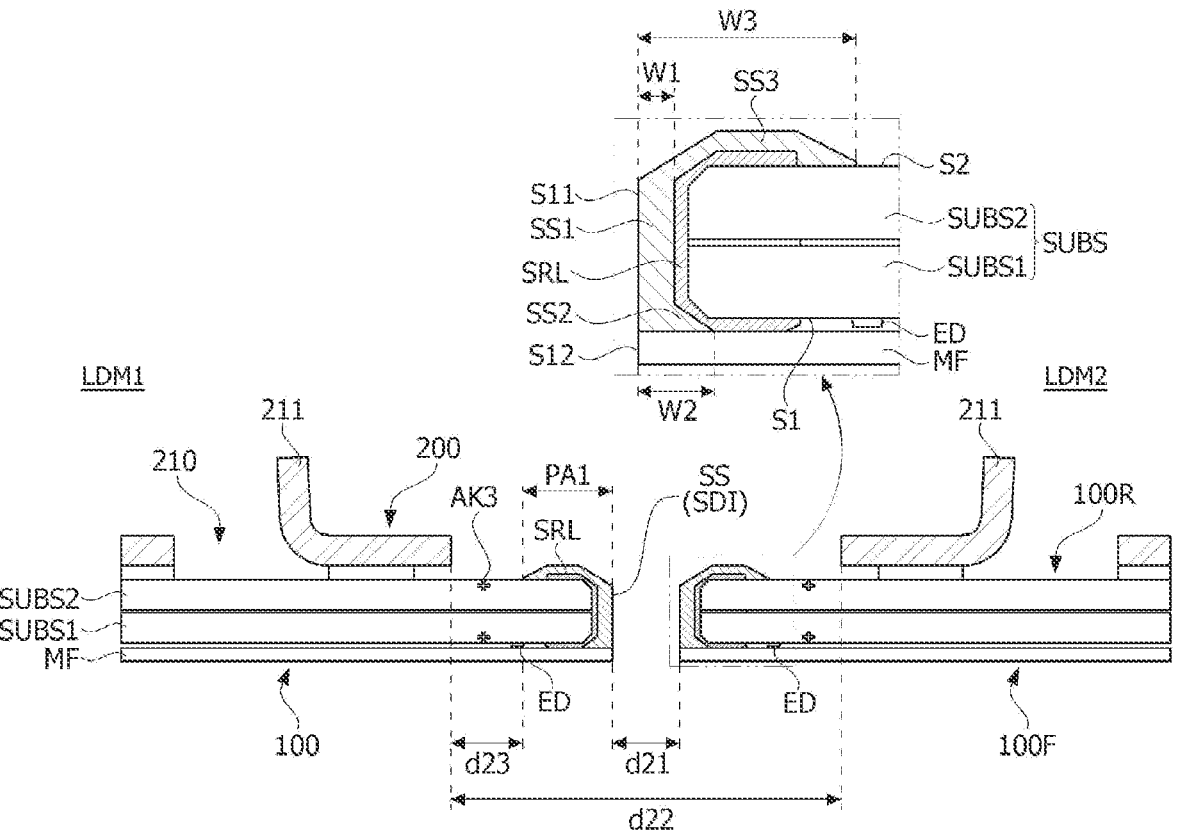
FIG. 11 is a cross-sectional view along line B-B' in FIG. 10.

FIG. 9 is a perspective view showing a state in which a plurality of display modules according to one or more embodiments of the present disclosure are fixed to a frame. FIG. 10 is an enlarged view of portion Q1 in FIG. 9. FIG. 11 is a cross-sectional view along line A-A' in FIG. 9.

Referring to FIG. 9, the plurality of display modules can be implemented as a large-screen tiling display device TD by being coupled to the frame 10. Although FIG. 9 shows that four display modules LDM1, LDM2, LDM3, and LDM4 are coupled to the frame 10, the number of display modules is not particularly limited thereto.

A plurality of protrusions 211 disposed on the plurality of display modules LDM1 to LDM4 may each be inserted into an insertion hole 11 of the frame 10. Thereafter, the protrusion 211 may be fixed to the insertion hole 11 so that the plurality of display modules LDM1 to LDM4 may be fixed to the frame 10. More specifically, the cover bottom 200 may include a plurality of protrusions 211 disposed in a regularly or irregularly spaced pattern along an outer boundary or periphery of the cover bottom 200. The protrusions 211 may have a length that is greater than their width, and in some aspects, may be several times longer than wide to provide the protrusions 211 with a narrow and elongated shape. The protrusions 211 may extend from a rear surface 200R of the cover bottom 200 in a direction away from the front surface 100F of the display panel 100. Further, the protrusions 211 may be arranged in single rows and columns (i.e., to form a single "frame" of protrusions 211 spaced a selected distance from the outer edge of the cover bottom 200) or may be in multiple rows and columns to form multiple concentric and overlapping frames with set spacing between each row and column of protrusions 211. In general, the protrusions 211 may have any selected size, shape, spacing, and arrangement on the rear surface 200R of the cover bottom 200. In an embodiment, the insertion holes 11 in the frame 10 generally corresponding in number, size, shape, and arrangement to the protrusions 211 on the cover bottom 200 so that each insertion hole 11 receives a single corresponding protrusion 211, although other arrangements and configurations are contemplated.

As shown in FIG. 9, when multiple display modules LDM1-LDM4 are tiled together in a tiling display device TD, the protrusions 211 and insertion holes 11 may form two rows or columns on interior portions 101 and only a single row or column on exterior portions 10E of the display modules LDM1-LDM4 and frame 10. In other words, each display module LDM1-LDM4 is surrounded by protrusions 211 at its outer boundary or periphery such that when two display modules LDM1-LDM4 are placed adjacent to each other, such as interior connection points, there are two rows or columns (depending on orientation) of protrusions 211 and corresponding holes 11 in the frame 10.

According to the embodiment, since the plurality of display modules LDM1 to LDM4 are coupled to the frame 10 to form the tiling display device TD, it is preferable to maintain a constant distance between the plurality of display modules LDM1 to LDM4 to allow for display of uniform images, and planarization work may be beneficial to prevent a step between the display modules LDM1-LDM4.

FIG. 10 is an enlarged view of portion Q1 in FIG. 9 showing the spacing between the display modules LDM1-LDM4 once they are attached to the frame 10. FIG. 11 is a cross-sectional view along line B-B' in FIG. 10.

Referring to FIGS. 10 and 11, in a state of being coupled to the frame 10, the display modules LDM1, LDM2 may be disposed to be spaced a predetermined distance from each other. When the plurality of display modules LDM1-LDM4 are fixed to the frame 10 without any distance therebetween, there may be a problem that the boundary between the plurality of display modules LDM1-LDM4 is visible due to a step occurring due to an assembly tolerance. In other words, when the display modules LDM1-LDM4 are installed without spacing between the modules LDM1-LDM4 in the frame 10, manufacturing or assembly tolerances can lead to the display modules LDM1-LDM4 overlapping each other at the interface(s) between the display modules LDM1-LDM4, thus creating a step between the display modules LDM1-LDM4 that is visible to the user as a seam between the display modules LDM1-LDM4. Therefore, the plurality of display modules LDM1 and LDM2 disposed adjacent to each other to form the integrated tiling display device TD may preferably be spaced a predetermined distance from each other.

More specifically, a first separation distance d21 is preferably provided between the plurality of display modules LDM1 and LDM2 and may be in a range of 1 to 200 μm. The first separation distance d21 reduces or minimizes the likelihood of an interference problem due to tolerance or thermal deformation, thereby making a seam area between display modules LDM1, LDM2 invisible even in a state in which the plurality of display modules LDM1-LDM4 are fixed to the frame 10. However, the first separation distance d21 is not necessarily limited thereto and may be adjusted in various ways depending on a structure or size of the display panel 100.

As described above, the first pad electrode PAD1 may be disposed on an outermost portion of one surface S1 of the display panel 100, which may be the front surface 100F of the display panel 100, and the second pad electrode PAD2 may be disposed on an outermost portion of the other surface S2, which may be the rear surface 100R of the display panel 100. The first pad electrode PAD1 and the second pad electrode PAD2 may be electrically connected by the side line SRL. The protection layer SS may be formed on the side line SRL. The protection layer SS may include black ink or an organic/inorganic material layer.

The cover film MF attached to display panel 100 may have a side surface parallel to a side surface of the protection layer SS, as best shown in FIG. 11. In other words, a side surface S12 of the cover film MF and a side surface S11 of the protection layer SS may be disposed on the same plane (i.e., coplanar) and may be parallel. Therefore, the first separation distance d21 between the protection layers SS may be the same as the separation distance d21 between the cover films MF in the two neighboring display modules LDM1 and LDM2.

The protection layer SS may include a first area SS1 formed on the side surface of the substrate SUBS, a second area SS2 extending to the one surface S1 (or front surface) of the substrate SUBS, and a third area SS3 connected to the other surface S2 (or rear surface) of the substrate SUBS. As shown in FIG. 11, the first area SS1 of the protection layer SS may be a vertical portion (i.e., extending up and down) of a relatively constant thickness or width W1 over its height. The second area SS2 of the protection layer SS is joined to and integral with the first area SS1 at the bottom of the first area SS1 and may be a portion that extends under part of the substrate SUBS toward the front surface S1 of the substrate SUBS and may taper in thickness over its length in a left to right direction. As shown in FIG. 11, the second area SS2 may have a width W2 that is greater than the width W1. The third area SS3 of the protection layer SS is joined to and integral with the first area SS1 at the top of the first area SS1 and may be portion that extends over or on top of substrate SUBS toward the rear surface S2 of the substrate SUBS. The third area SS3 has a varying thickness or height over its length and may include a first sloped section extending at an angle away from the rear surface S2, a flat portion, and a second sloped section that extends at an angle toward the rear surface S2 in consecutive order similar to the top portion of a trapezoid with angled sides on opposite sides of a flat side. In the immediately preceding description, the directional indicators such as vertical, up, down, left, right, and the like are used only to provide details regarding the illustrated embodiment. In practice, the display modules LDM1, LDM2 and their component parts described immediately above may be arranged in any orientation.

In an embodiment, a width W3 of the third area SS3 may be greater than a width W2 of the second area SS2. The second area S22 may not cover a portion of the side line SRL formed on the front surface S1 of the substrate SUBS. This is because the protection layer SS is formed after the cover film MF is attached to the front surface S1 of the substrate SUBS on which the side line SRL is formed. Accordingly, the side line SRL is already in contact with the cover film MF when the protection layer SS is formed such that the protection layer SS is not disposed between the side line SRL and the cover film MF in some embodiments. The third area SS3 of the protection layer SS may be formed to be sufficiently large to cover the side line SRL exposed on the other surface S2 of the substrate SUBS.

An area of the cover bottom 200 may be smaller than an area of the display panel 100. Therefore, the cover bottom 200 may not cover the protection layer SS formed on the side surface of the display panel 100. This is because interference with the neighboring display modules LDM may occur upon the occurrence of an assembly tolerance or the like when the cover bottom 200 is designed to have the same area as the display panel 100. Therefore, the cover bottom 200 may be spaced a predetermined distance from the protection layer SS and may not overlap the protection layer SS.

Therefore, in the neighboring display modules LDM1 and LDM2, a second separation distance d22 between the cover bottoms 200 may be greater than the first separation distance d21 between the protection layers SS.

With this configuration, the cover bottom 200 may expose an alignment key AK3 for arranging the display panel 100 at the correct position on a jig (or an adsorption plate to be described below). The alignment key AK3 may be disposed in a separation space d23 between the cover bottom 200 and the protection layer SS. However, the present disclosure is not necessarily limited thereto, and the cover bottom 200 may extend to cover the protection layer SS. In this case, a hole (not shown) for exposing the alignment key AK3 may be formed in the cover bottom 200.

The cover bottom 200 may include a plurality of protrusions 211 to be coupled to the frame 10. The protrusion 211 may be formed by cutting and bending a portion of the cover bottom 200 in some embodiments. Therefore, the protrusion 211 may be formed at one side of an opening 210 formed by cutting the cover bottom 200. As a result, the protrusion 211 may have a generally "L" shape with the vertical extension of the "L" being a portion of the cover bottom 200 that is cut and bent to extend away from the cover bottom 200, thus exposing the hole 210. The angle of the extension of the protrusion 211 is not limited and may be selected, although the angle may preferably be 90 degrees or approximately 90 degrees (i.e., between 80 degrees and 100 degrees) in some embodiments. However, the present disclosure is not necessarily limited thereto, and a separate protrusion may be coupled to the cover bottom 200 to provide the protrusions 211 without forming the holes 210. In other words, various known methods can be applied to form the protrusion 211.

Figure 12:
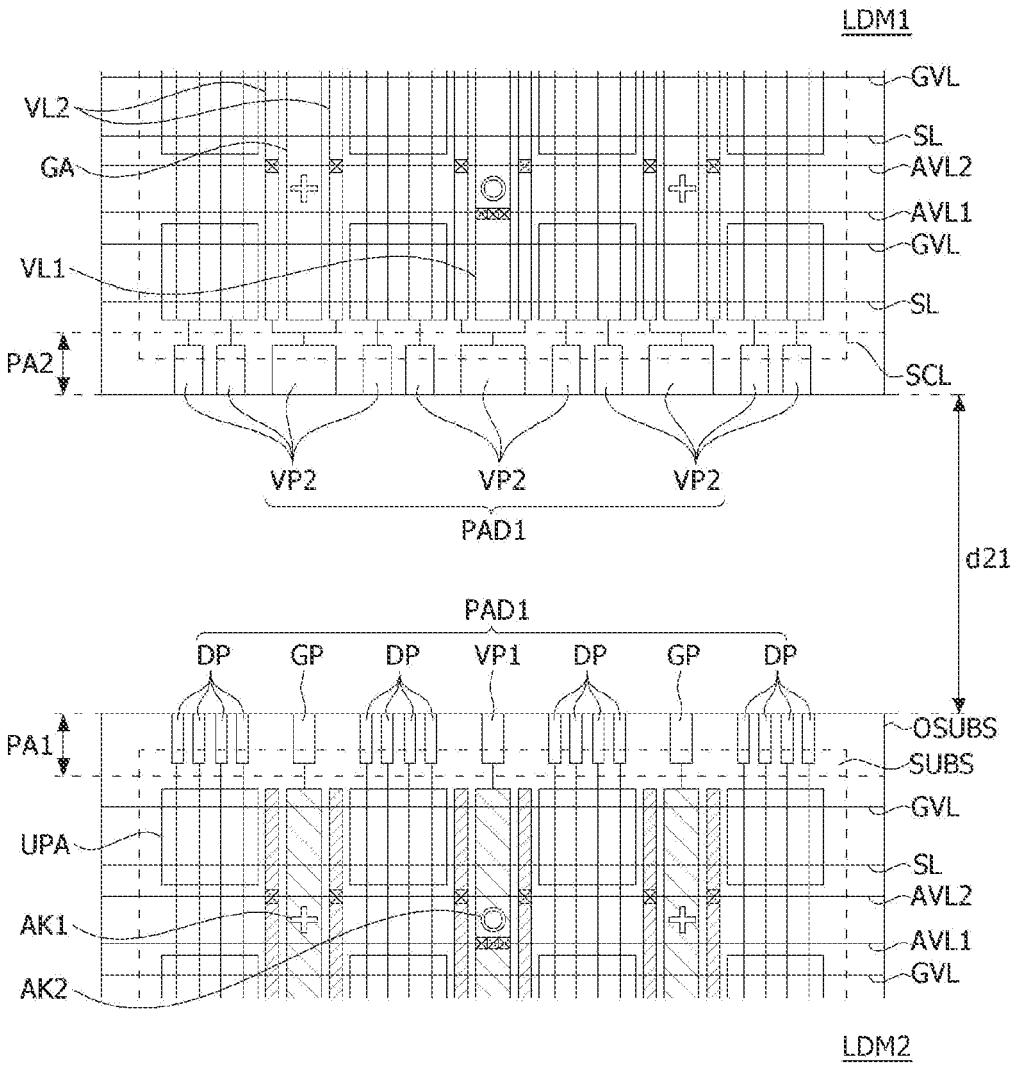
FIG. 12 is a view showing shapes of electrode pads disposed on display panels of neighboring display modules of FIG. 9.
Figure 13:
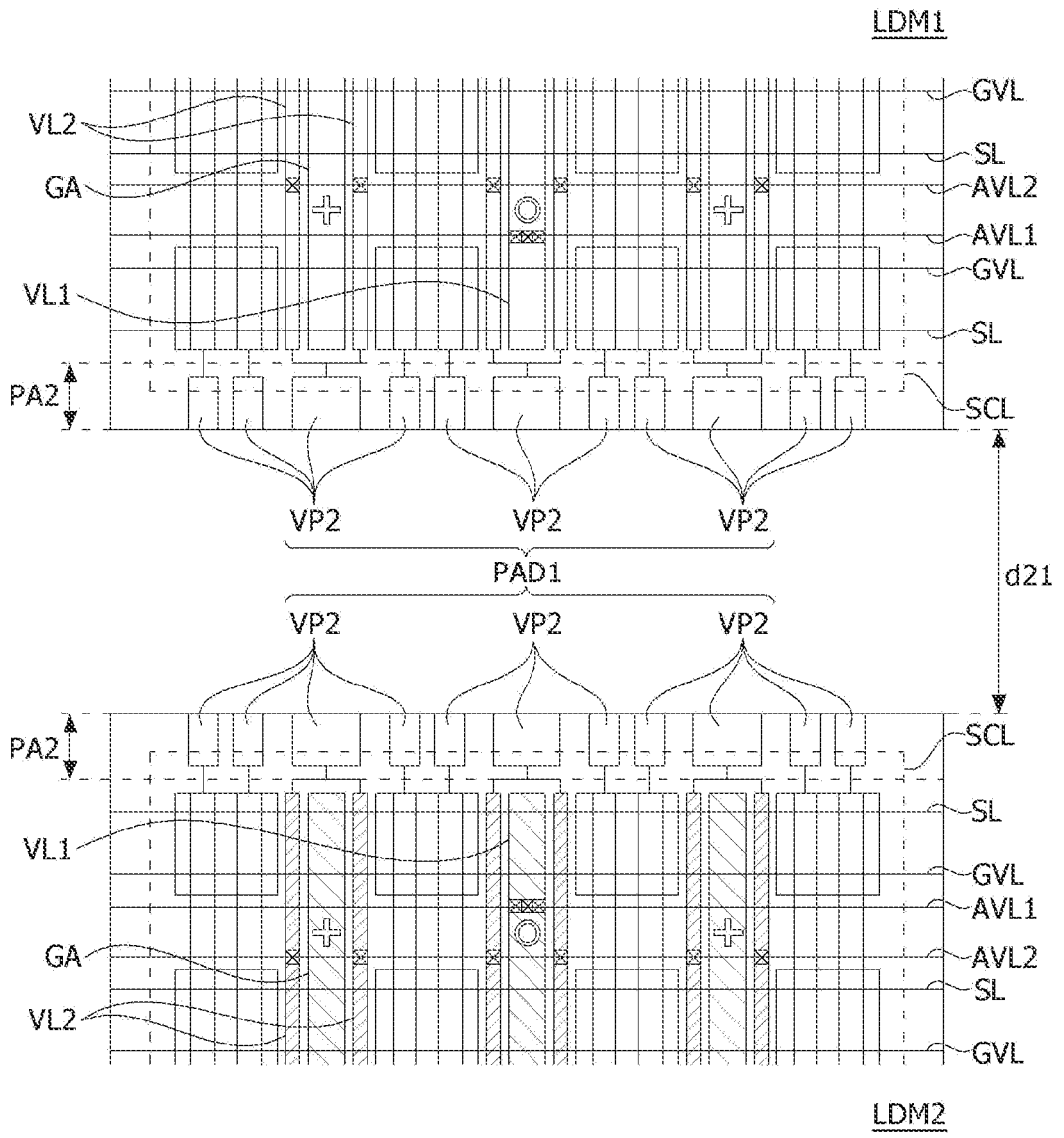
FIG. 13 is a view showing an embodiment of electrode pads disposed on successive display modules according to the present disclosure.
Figure 14:
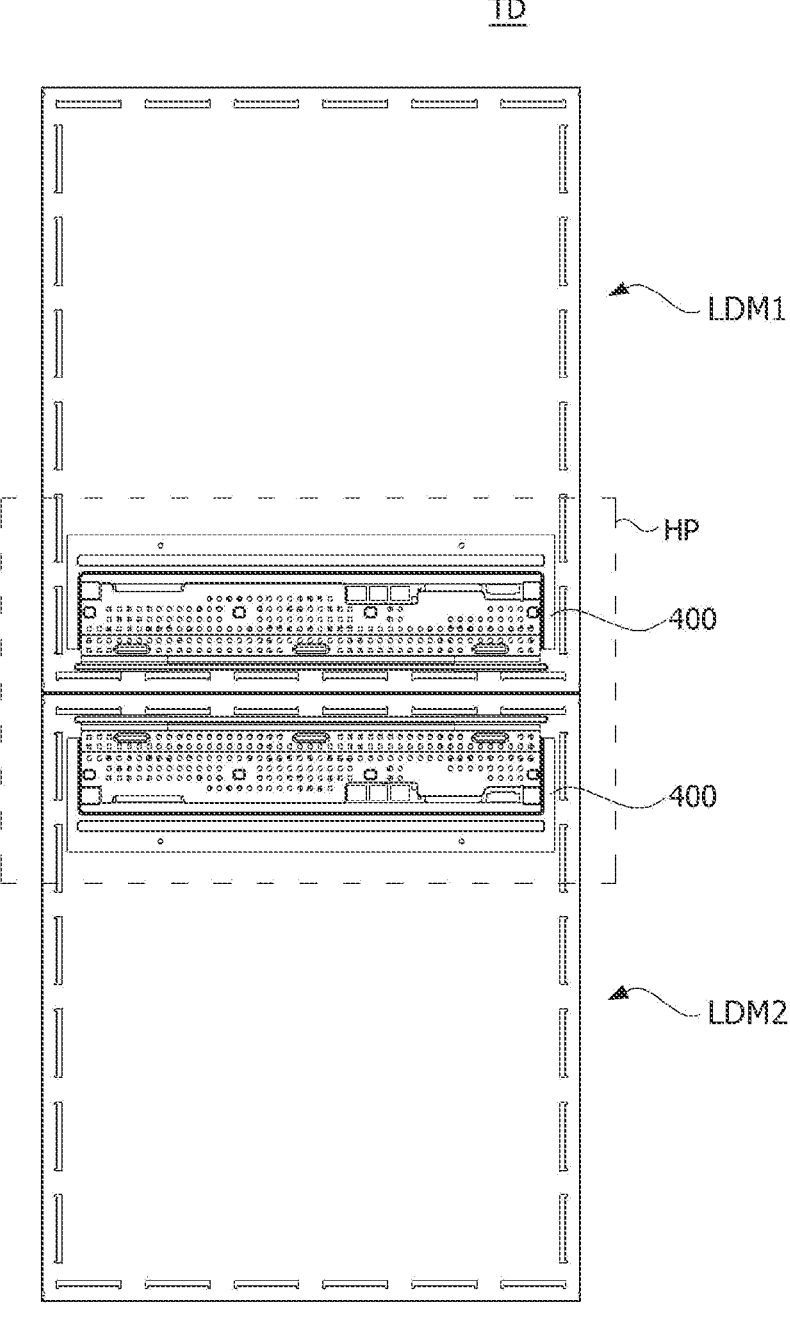
FIG. 14 is a view showing two display modules of FIG. 13 disposed adjacent to each other.
Figure 15:
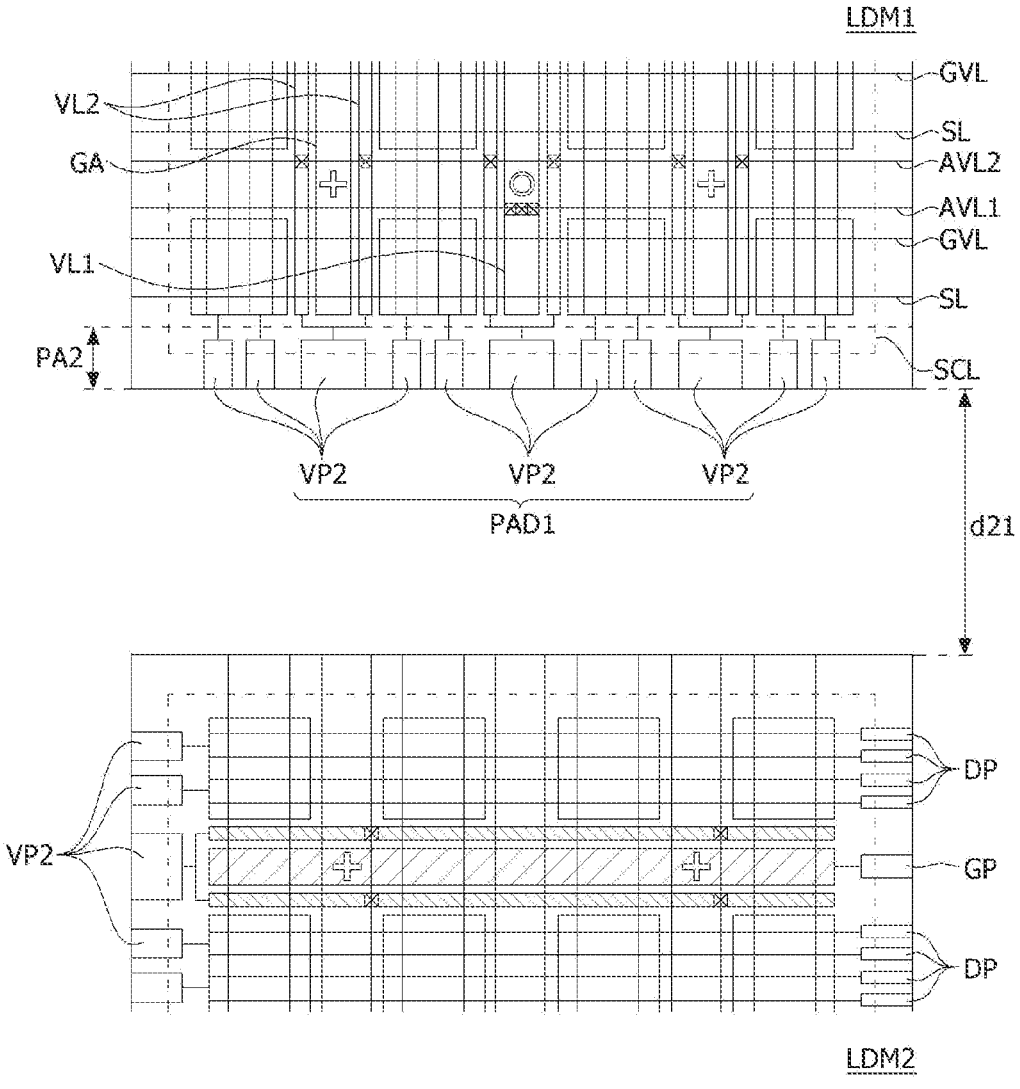
FIG. 15 is a view showing an embodiment of electrode pads disposed on successive display modules according to the present disclosure.
Figure 16:
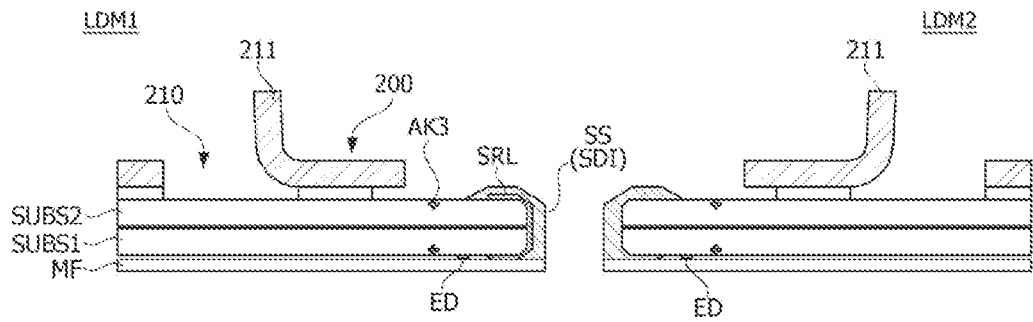
FIG. 16 is a view showing a cross-sectional structure of two successive display modules of FIG. 15.

FIG. 12 is a view showing shapes of electrode pads disposed on the display panel of neighboring display modules LDM1, LDM2. FIG. 13 is a view showing a first modified example of FIG. 12. FIG. 14 is a view showing a state in which two display modules are disposed according to that of FIG. 13. FIG. 15 is a view showing a second modified example of FIG. 12. FIG. 16 is a view showing a cross-sectional structure of two display modules according to that of FIG. 15.

Referring to FIG. 12, the plurality of display modules LDM1-LDM4 may be sequentially disposed in the X-axis and Y-axis directions. Therefore, shapes of pads in areas in which neighboring first display modules LDM1 and second display modules LDM2 face each other may be different, meaning the pads PAD1, PAD2 at the interfaces between consecutive display modules of the plurality of display modules LDM1-LDM4 may be different. As described with reference to FIG. 5, the power pads VP1 and VP2 of the display panel 100 may include the plurality of high-potential power pads VP1 disposed on the first pad area PA1 and the plurality of low-potential power pads VP2 disposed on the second pad area PA2. The data pad DP and the gate pad GP may be further disposed on the first pad area PA1.

The data pad DP and the gate pad GP may have relatively smaller widths, and the power pads VP1 and VP2 may have relatively greater widths. In addition, the low-potential power pads VP2 may have greater widths than the high-potential power pads VP1.

Therefore, since the low-potential power pads VP2 disposed on the second pad area PA2 of the first display module LDM1 are disposed to face the high-potential power pads VP1 disposed on the first pad area PA1 of the second display module LDM2, a width of the pad electrode PAD1 disposed on the side surface of the first display module LDM1 may be greater than a width of the pad electrode PAD1 disposed on the side surface of the facing second display module LDM2.

Referring to FIGS. 13 and 14, the width of the pad electrode PAD1 disposed on the side surface of the first display module LDM1 may be the same as the width of the pad electrode PAD1 disposed on the side surface of the second display module LDM2. In this case, the circuit boards 400 of the first and second display modules LDM1 and LDM2 may be disposed adjacent to each other.

With this arrangement, it is possible to increase heat dissipation efficiency by arranging the circuit boards 400 from which more heat is generated to face each other or be proximate each other and forming a heat dissipation structure in a high heat source area HP in which heat is concentrated in the tiled display device TD.

Referring to FIGS. 15 and 16, while the pad electrode PAD1 is formed on the side surface of the first display module LDM1, the electrode pad may not be formed on the side surface of the facing second display module LDM2. Therefore, while the side line SRL is formed on the side surface of the first display module LDM1, the side line may not be formed on the side surface of the facing second display module LDM2 depending on the arrangement of the display modules LDM1, LDM2. According to the embodiment, since the display device TD is manufactured by tiling the plurality of display modules LDM1-LDM4, the display modules LDM1-LDM4 may be coupled by being rotated in different directions due to various issues (light uniformity and the like).

Figure 17:
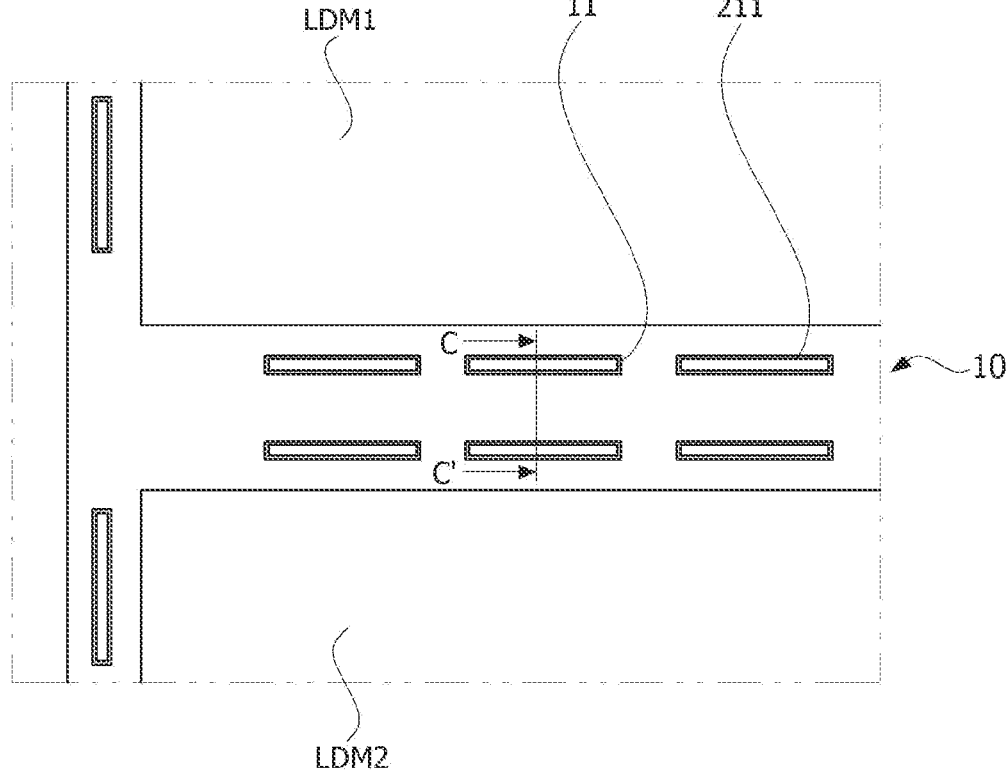
FIG. 17 is a plan view showing the plurality of display modules of FIG. 7 coupled together.
Figure 18:
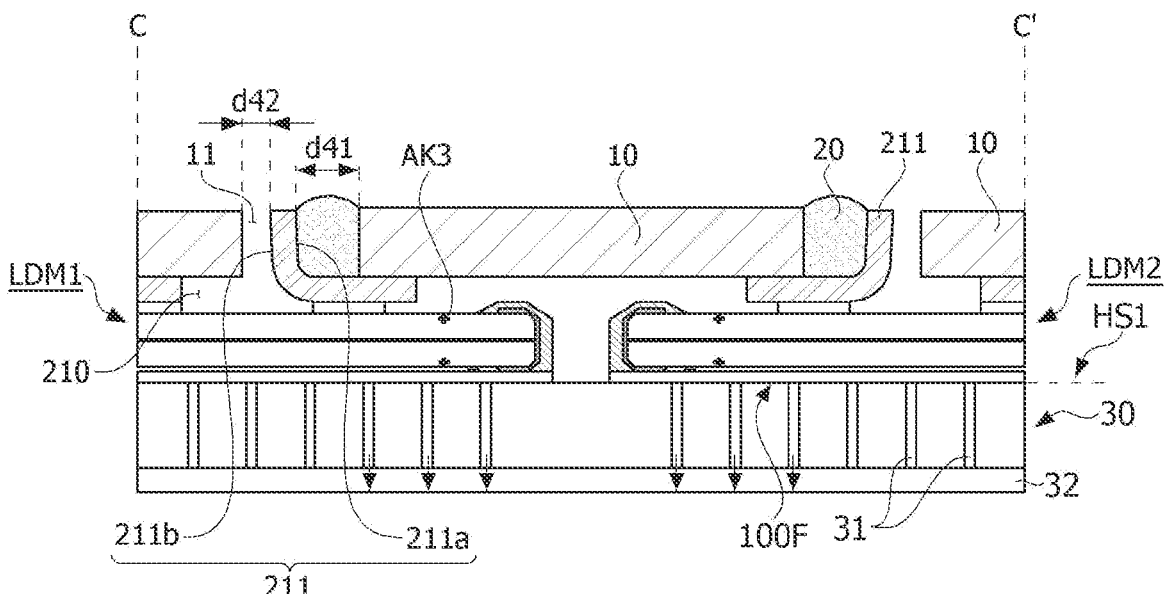
FIG. 18 is a cross-sectional view along line C-C' in FIG. 17.

FIG. 17 is a plan view showing a state in which the plurality of display modules LDM1-LDM4 are coupled to the frame 10. FIG. 18 is a cross-sectional view along line C-C' in FIG. 17.

Referring to FIGS. 17 and 18, the plurality of display modules LDM may be aligned on an adsorption plate 30. When the plurality of display modules LDM are disposed at a predetermined position on the adsorption plate 30 using the alignment key AK3, the plurality of display modules LDM1 and LDM2 may be disposed to be spaced a predetermined distance from each other.

The adsorption plate 30 may be disposed on the front surface 100F of the display panel 100 of the plurality of display modules LDM1 and LDM2 and may be in some aspects be disposed directly on the front surface 100F of the display panel 100, and more specifically, directly on the cover film MF. The adsorption plate 30 includes suction holes 31 through the plate 30 and a suction line 32 in communication with the suction holes 31. The adsorption plate 30 can be connected to a vacuum device to provide negative air pressure to the front surfaces 100F of the display panels 100 of the modules LDM1, LDM2 through the suction line 32 and holes 31 and align the front surfaces 100F on the generally flat and planar rear surface of the adsorption plate 30. Accordingly, the adsorption plate 30 assists with aligning the front surfaces of the plurality of display modules LDM1 and LDM2 to be disposed parallel to a horizontal surface HS1 or horizontal plane HS1 and assembled flat. The front surface 100F of the display panels 100 of the plurality of display modules LDM1 and LDM2 may be surfaces from which images are output and may also correspond to the front surface of the display modules LDM1, LDM2 generally (i.e., the front surface 100F of the display panel 100 is the front surface 100F of the display modules LDM1, LDM2).

The frame 10 may be disposed at the other sides of the plurality of display modules LDM1 and LDM2, meaning the rear surfaces of the display modules LDM1, LDM1 that are generally defined by cover bottom 200 described above. The plurality of protrusions 211 may be fixedly inserted into the insertion holes 11 of the frame 10. When the insertion holes 11 of the frame 10 are filled with a resin 20 and cured, the plurality of protrusions 211 may be fixed to the insertion holes 11. The resin may be made of various materials which may be cured by heat or light without limitation. In addition, an adhesive may be made of various materials other than a curable resin. For example, the resin may be a two-component resin.

In a state in which the front surfaces of the plurality of display modules LDM1 and LDM2 are parallel to each other, depths to which the protrusions 211 of the plurality of display modules LDM1 and LDM2 are inserted into the insertion holes 11 may be different. Some protrusions 211 of the display module LDM may be deeply inserted into the insertion holes 11, and the other protrusions 211 of another display module LDM may be shallowly inserted into the insertion holes 11.

The reason why the insertion depths are different is that when the front surfaces of the plurality of display modules LDM with different assembly steps are planarized, a step occurs on an opposite surface. However, the present disclosure is not necessarily limited thereto, and when there is no assembly tolerance, a step may not occur in the state in which the one surfaces of the plurality of display modules LDM1 and LDM2 are parallel to each other.

When the protrusions 211 of the plurality of display modules LDM1 and LDM2 are fixed to the frame 10 in the state in which the front surfaces of the plurality of display modules LDM1 and LDM2 are disposed parallel to the horizontal surface HS1, the front surfaces of the plurality of display modules LDM1 and LDM2 can maintain on the same plane, namely the horizontal surface or plane HS1.

Conventionally, to achieve the same result using planarization work involves using a separate planarization structure, additional components, and much additional time. However, according to the disclosure, it is possible to overcome these disadvantages and quickly and accurately assemble the plurality of display modules LDM1 and LDM2 flat without any additional component.

The protrusion 211 of the first display module LDM1 may include a first surface 211a facing the protrusion 211 of the second display module LDM2 and a second surface 211b which is a surface opposite to the first surface 211a. In this case, a distance d41 between the first surface 211a and the frame 10 may be greater than a distance d42 between the second surface 211b and the frame 10.

In other words, when the frame 10 is aligned on the plurality of aligned display modules LDM1 and LDM2, the distance d41 between the first surface 211a and the frame 10 may be greater than the distance d42 between the second surface 211b and the frame 10. To enable such a structure, formation positions of the insertion holes 11 on the frame 10 may be adjusted. According to the embodiment, the distance d41 between the first surface 211a of the protrusion 211 and the frame 10 may relatively increase, making it easier to inject the resin 20. A nozzle is inserted into a space between the first surface 211a and the frame 10, and the space may be locally filled with the resin 20.

The resin may not be injected into the distance d42 between the second surface 211b of the protrusion 211 and the frame 10. This is because the resin may enter the display panel 100 because the second surface 211b of the protrusion 211 is connected to the opening 210. However, the present disclosure is not necessarily limited thereto, and an adhesive force may be strengthened by filling the entire insertion hole 11 with resin, which may include modifications or additions to the cover bottom 200 and/or openings 210 (such as a plate under the openings 210 or an additional structure on the substrate SUBS to limit ingress of resin) to enable filling the distance d42 with resin 20 without corresponding negative impacts to the display panel 100.

Figure 19A:
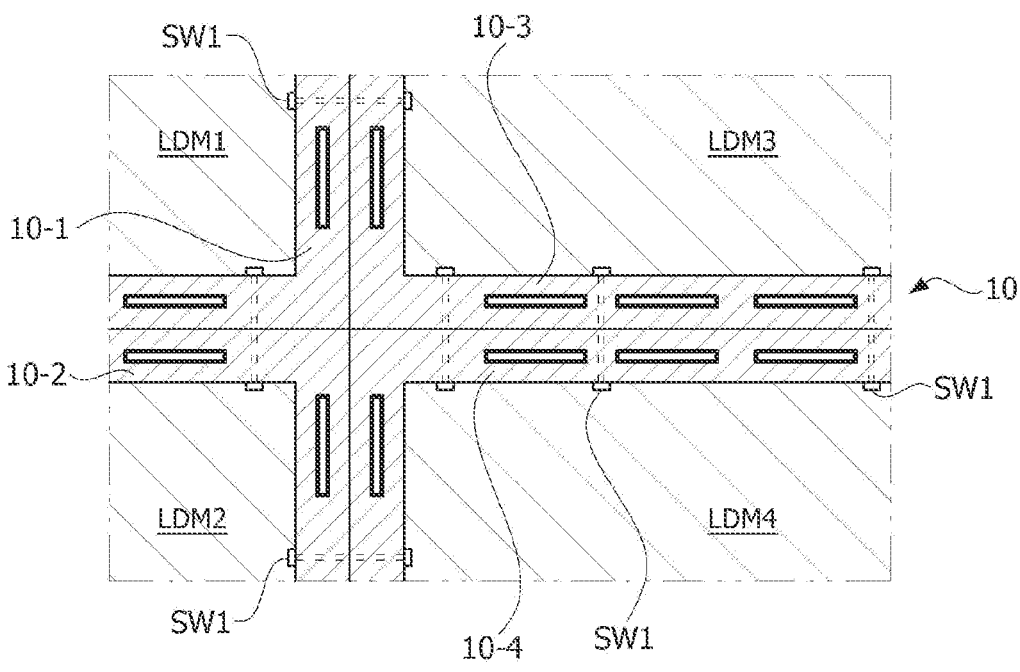
FIG. 19A is a view showing an embodiment of a frame configured as a plurality of sub-frames according to the present disclosure.
Figure 19B:
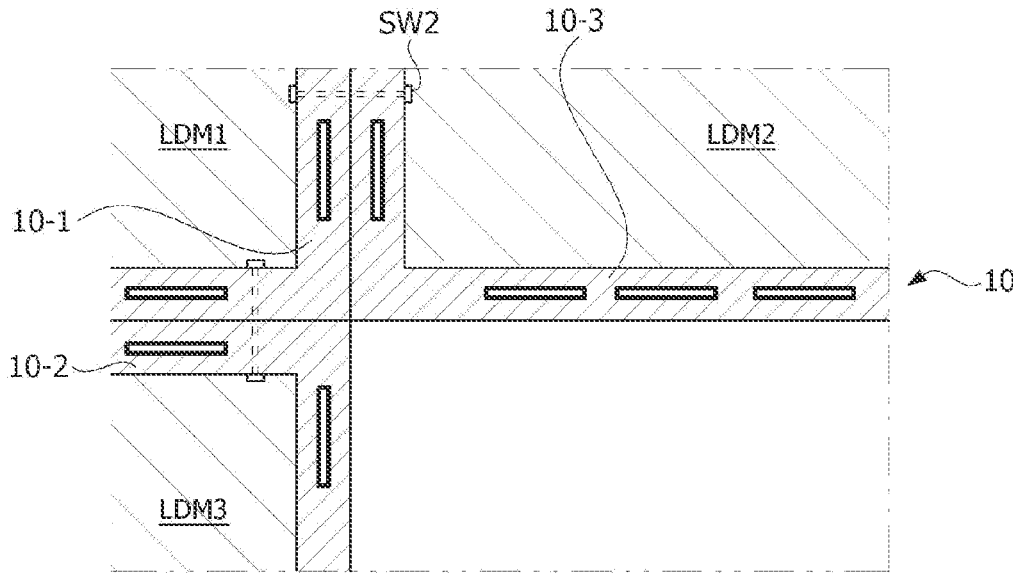
FIG. 19B is a view showing a state in which some of the plurality of sub-frames of FIG. 19A are separated.

FIG. 19A is a view showing a state in which the frame according to one or more embodiments of the present disclosure is configured as a plurality of sub-frames. FIG. 19B is a view showing a state in which some of the plurality of sub-frames are separated.

Referring to FIGS. 19A and 19B, the frame 10 may be divided into a plurality of sub-frames 10-1, 10-2, 10-3, and 10-4. The plurality of sub-frames 10-1, 10-2, 10-3, and 10-4 may be assembled to one integrated frame 10 by fixing pins SW1. In addition to the fixing pins SW1, support members (e.g., fixing clips) capable of adjusting and maintaining the flatness of the plurality of sub-frames 10-1, 10-2, 10-3, and 10-4 may be further included.

When some of the display modules need to be replaced after the display modules LDM1 to LDM4 are coupled to the frame 10, the display module LDM may be replaced by being separated from a neighboring sub-frame to which the display module LDM to be replaced is coupled.

For example, when the fourth display module LDM4 needs to be replaced or removed to undergo maintenance, the fourth sub-frame 10-4 and the fourth display module LDM4 may be removed from the display device by removing the fixing pins SW1 for fixing the second and third sub-frames 10-2 and 10-3 neighboring to the fourth sub-frame 10-4. Thereafter, another display module may be coupled to the neighboring second and third sub-frames 10-2 and 10-3 by being assembled to the sub-frame.

With this configuration, there is an advantage in that the display module LDM may be easily fixed to the frame 10 using the resin and replaced.

Figure 20:
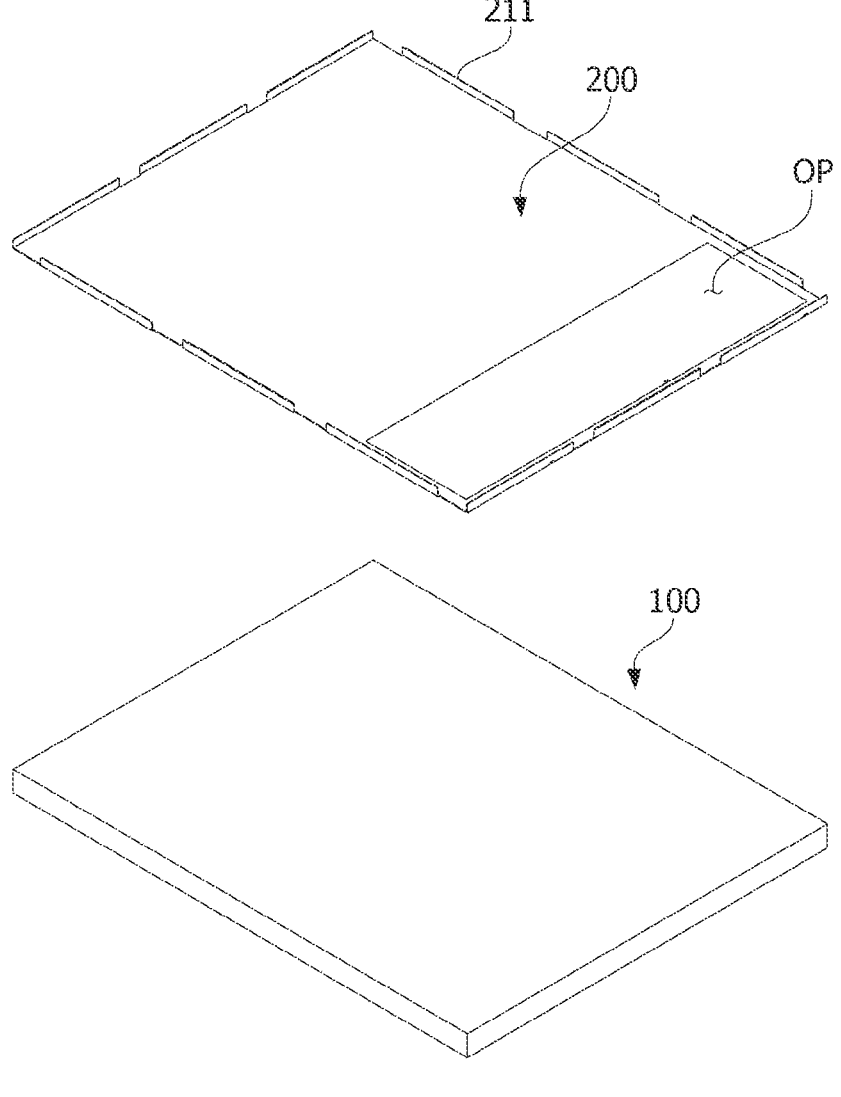
FIG. 20 is a view showing a modified structure of a protrusion of a display module according to an embodiment of the present disclosure.
Figure 21:
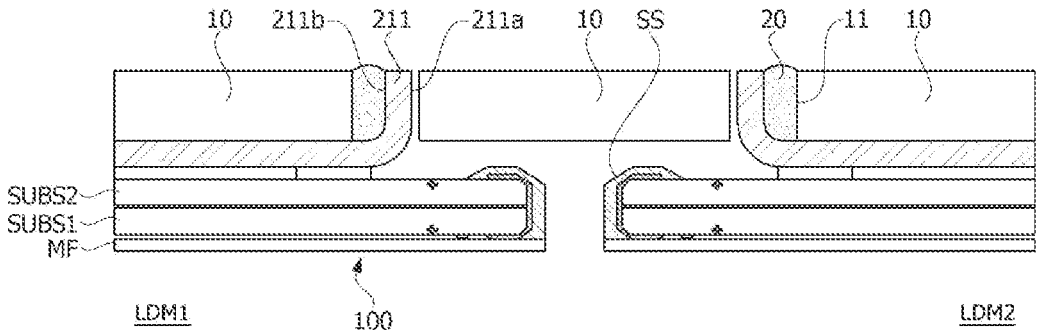
FIG. 21 is a view showing a state in which the display modules in FIG. 20 are coupled to the frame.

FIG. 20 is a view showing a modified structure of a protrusion of the display module according to one or more embodiments of the present disclosure. FIG. 21 is a view showing a state in which the display modules in FIG. 20 are coupled to the frame.

Referring to FIGS. 20 and 21, the protrusion 211 may be formed by bending an outermost portion of the cover bottom 200 without cutting a portion thereof to form openings 210 as described above. The protrusion 211 may be disposed at the outermost portion or outermost edge of the cover bottom 200. The cover bottom 200 may be disposed behind the protection layer SS to expose the alignment key.

The protrusion 211 may include the first surface 211a on which the neighboring display modules LDM1 and LDM2 face each other, and the second surface 211b which is a surface opposite to the first surface 211a. The resin 20 may fill an area between the frame 10 and the second surface 211b that face each other. Therefore, the resin 20 may be injected on the cover bottom 200 and may not fill the inside of the display panel 100. However, the present disclosure is not necessarily limited thereto, and the resin 20 may also fill between the first surface 211a and the frame 10. In an embodiment, the tolerances between the frame 10 and the first surface 211a of the protrusion 211 are small enough that the air gap between the same is not a concern and no resin is needed to fill this space. In an embodiment, the protrusions 211 and frame 10 are designed to have a friction fit or a snap fit between at least one of the surfaces 211a, 211b of the protrusion 211 and the frame 10, thus eliminating the need for resin 20.

Figure 22:
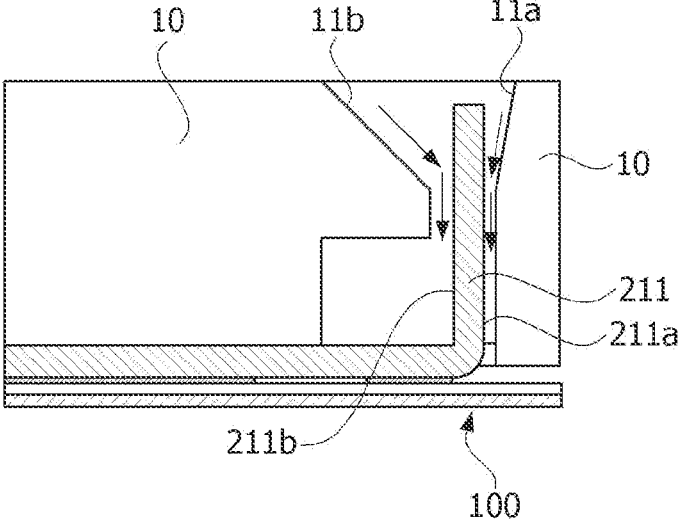
FIG. 22 is a view showing an inclined shape of an insertion hole of the frame.

Referring to FIG. 22, either one or both side surfaces 11a and 11b of the insertion hole 11 may be formed to be inclined to assist with injecting the resin 20. In other words, either or both of the side surfaces 11a, 11b of the insertion hole 11 may have a tapered shape, and the tapered shape may be formed to have a larger area toward the upper portion of the frame 10 similar to a funnel.

In addition, both side surfaces 11a and 11b of the insertion hole 11 may be formed at different inclination angles. For example, the second side surface 11b facing the second surface 211b and the frame 10 may be formed to have a larger inclination angle than the first side surface 11a resulting in the second side surface 11b having a shallower and flatter slope than the first side surface 11a (which has a relatively steeper slope) to assist with injection the resin 20.

Figure 23:
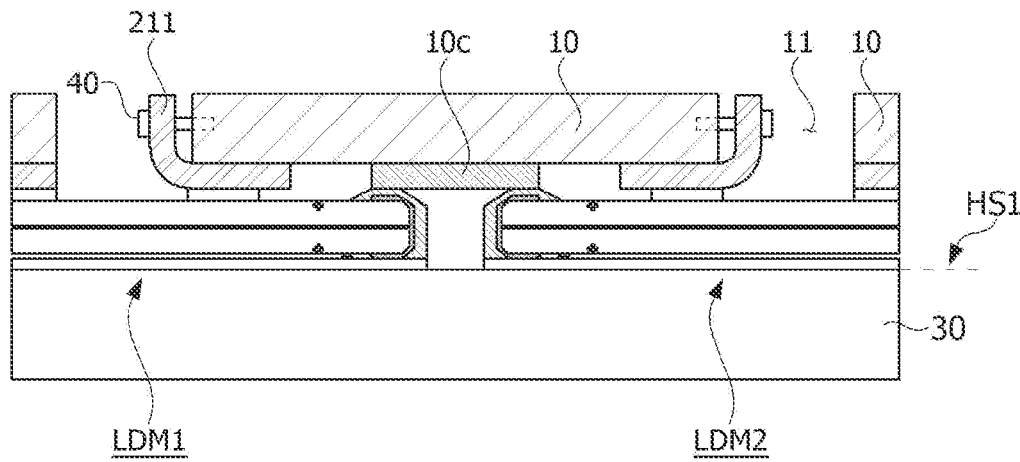
FIG. 23 is a view showing a protrusion of a display device fixed to a frame by fastening bolts according to an embodiment of the present disclosure.

FIG. 23 is a view showing a state in which the protrusion is fixed to the frame by fastening bolts.

Referring to FIG. 23, the protrusions 211 of the display modules LDM1 and LDM2 may be fixed to the frame 10 by the first bolts 40 in a state of being inserted into the insertion holes 11. With this configuration, there is an advantage in that the display module LDM may be removed, such as for replacement or maintenance, by removing the first bolts 40.

Additionally, since dust or foreign substance may flow into a gap between the display modules LDM, a pad part 10c for preventing the introduction of foreign substance may be disposed between the frame 10 and the display module LDM. The pad part 10c is not particularly limited and may have any shape, structure, or composition to cover and/or fill the separated area between the display modules LDM1 and LDM2 to prevent the introduction of foreign substance.

Figure 24:
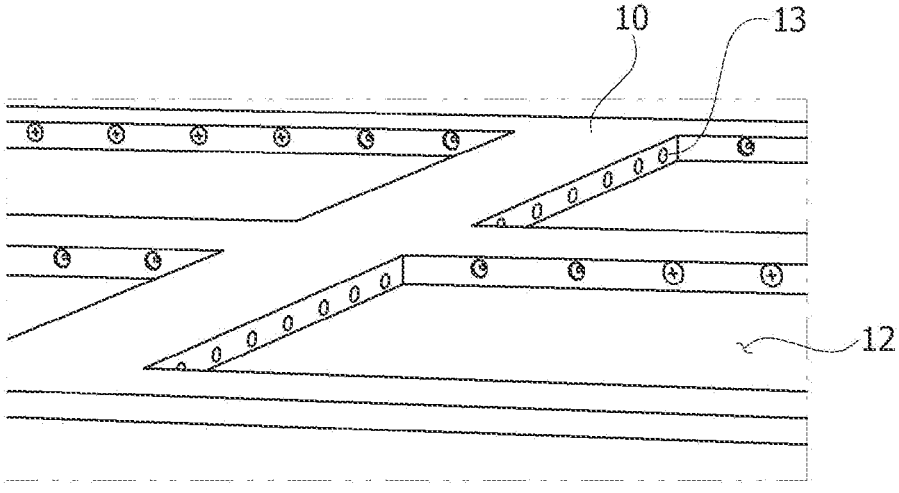
FIG. 24 is a view showing a plurality of second insertion holes in a frame in a display device according to an embodiment of the present disclosure.
Figure 25:
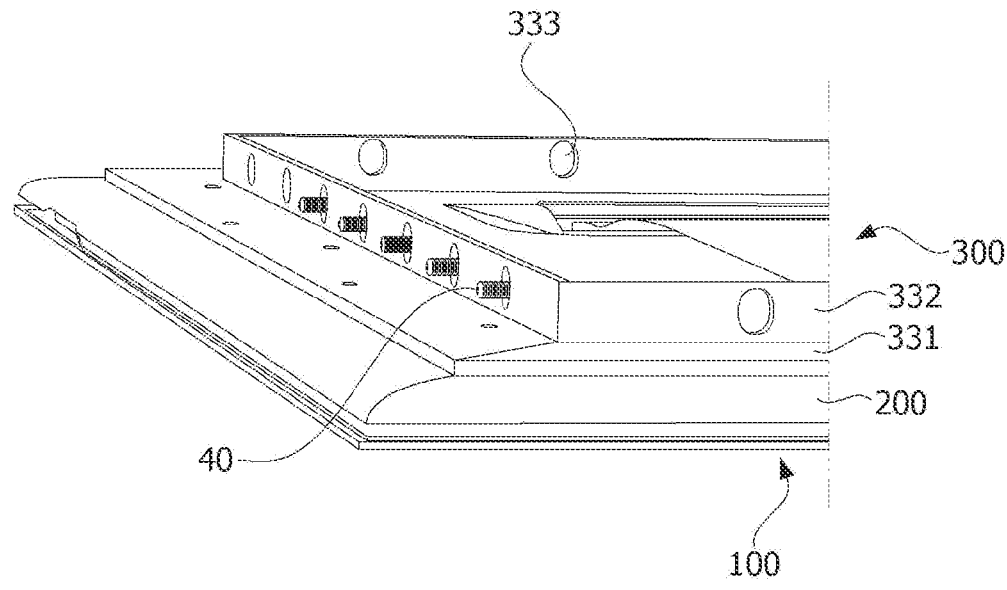
FIG. 25 is a view showing a separate reinforcement member attached to a display module for incorporation into the frame of FIG. 24.
Figure 26:
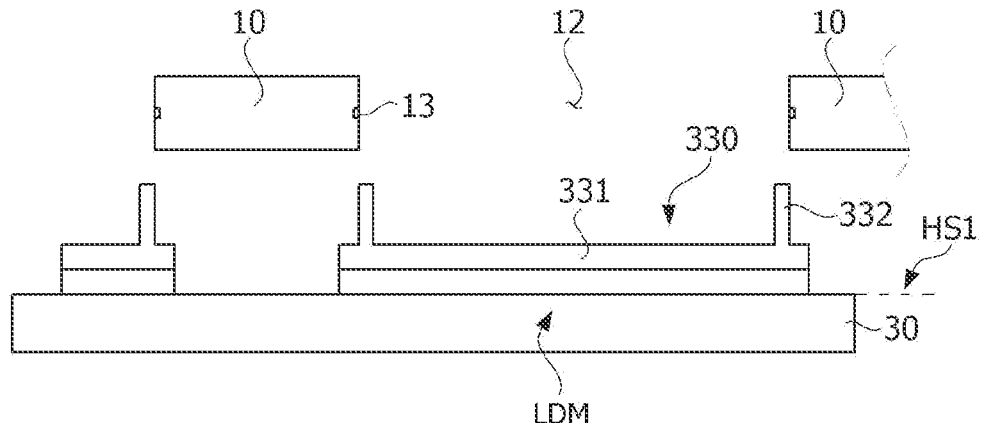
FIG. 26 is a view showing a plurality of display modules of FIG. 25 inserted into the frame of FIG. 24.
Figure 27:
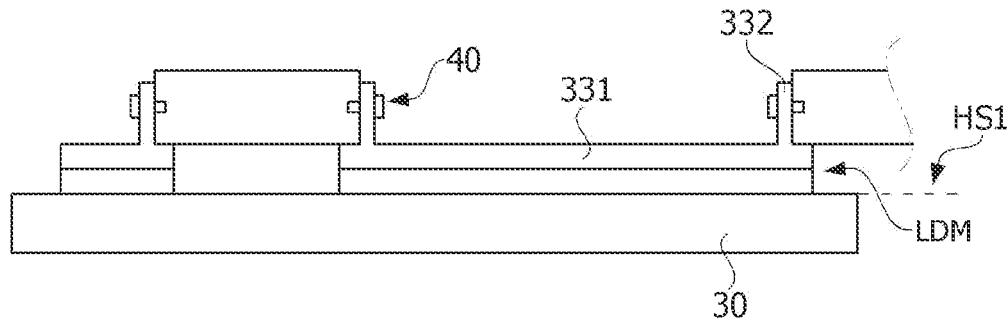
FIG. 27 is a view showing a further step in a process of fixing the plurality of display modules of FIG. 25 to the frame of FIG. 24.
Figure 28:
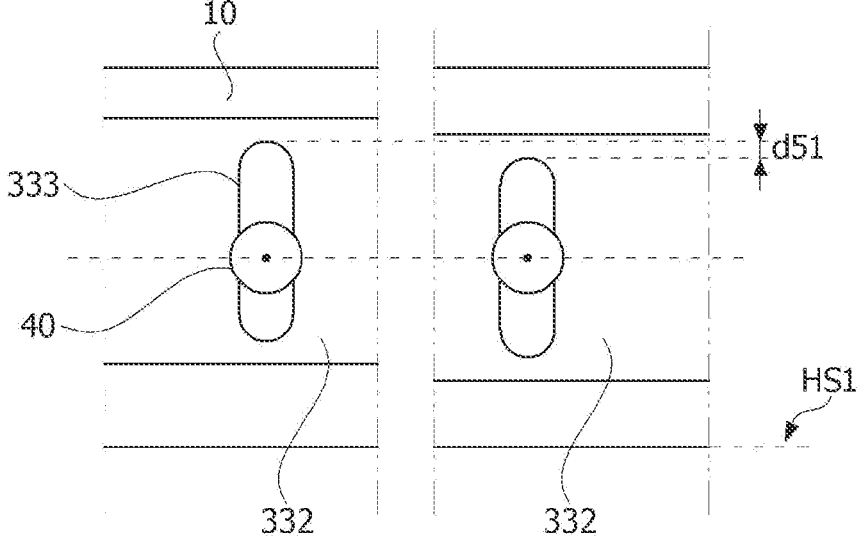
FIG. 28 is a view showing different positions at which first bolts are fixed to the frame of FIG. 24 in the display device.

FIG. 24 is a view showing a state in which a plurality of second insertion holes are formed in the frame of the display device according to one or more embodiments of the present disclosure. FIG. 25 is a view showing a state in which a separate reinforcement member is attached to the display module according to one or more embodiments of the present disclosure. FIG. 26 is a view showing a state in which the plurality of display modules are inserted into the frame according to one or more embodiments of the present disclosure. FIG. 27 is a view showing a state in which the plurality of display modules are fixed to the frame according to one or more embodiments of the present disclosure. FIG. 28 is a view showing a state in which positions at which the first bolts are fixed to the frame are different.

Referring to FIGS. 24 and 25, a second insertion hole 13 into which the protrusion 211 is fixed may be formed in a side surface of the opening area 12 of the frame 10. The opening area 12 of the frame 10 may be the opening in the frame 10 which receives a corresponding display module LDM. In addition, the protrusion 211 may be formed on a separate reinforcement member 300 coupled to the cover bottom 200.

The reinforcement member 300 may be disposed on a rear surface of the cover bottom 200, and a quadrangular protrusion 332 may be formed thereon. A long hole 333 may be formed in the quadrangular protrusion 332 and disposed at a position facing the second insertion hole 13 of the frame 10. The long hole 333 may be a hole formed to extend in a vertical direction.

Referring to FIGS. 26 and 27, the plurality of display modules LDM may be disposed on the adsorption plate 30 to keep the one surfaces parallel to the horizontal surface HS1, and then the reinforcement member 300 may be inserted into the opening area 12 of the frame 10 so that the quadrangular protrusion 332 may match the side surface of the opening area 12 of the frame 10. Thereafter, the plurality of display modules LDM may be fixed to the frame 10 by coupling the first bolts 40 to the long holes 333 of the protrusions 211.

Referring to FIG. 28, when the one surfaces of the plurality of display modules LDM with assembly steps are disposed on the adsorption plate 30 to keep the one surfaces parallel to each other, steps may occur on the other surfaces. Therefore, heights d51 of the quadrangular protrusions 332 inserted into the opening areas of the frame 10 may be different. However, since the long hole 333 is formed in the quadrangular protrusion 332, the first bolt 40 may be effectively coupled to the second insertion hole 13 of the frame 10. According to the embodiment, positions of the first bolts 40 coupled to the long holes 333 may be different.

Figure 29:
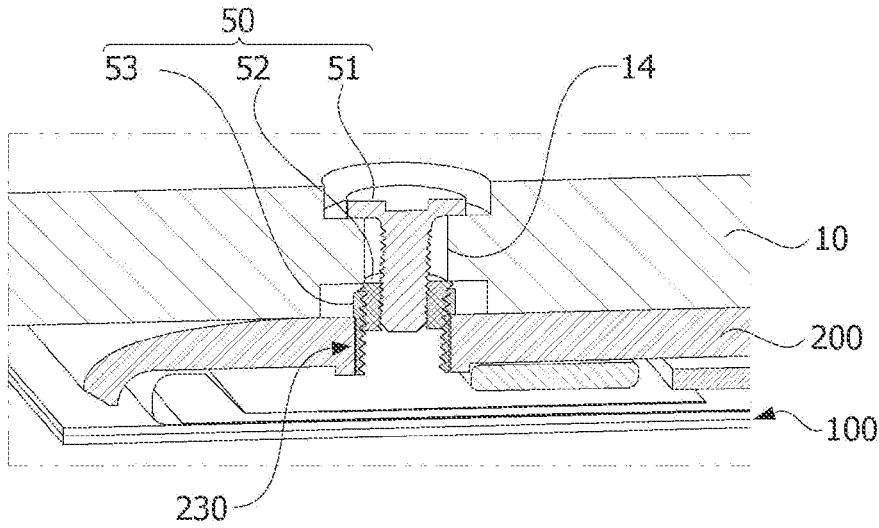
FIG. 29 is a cross-sectional view showing the frame and the display module coupled by a first fixing member in a display device according to an embodiment of the present disclosure.
Figure 30:
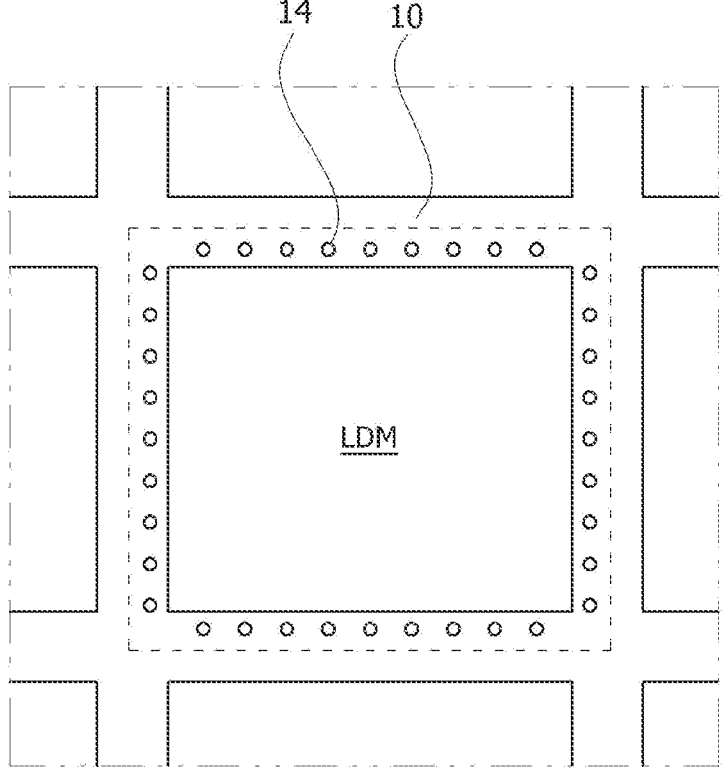
FIG. 30 is a view showing a plurality of insertion holes in a frame in a display device according to an embodiment of the present disclosure.

FIG. 29 is a view showing a state in which the frame and the display module are fixed by a first fixing member in a display device according to another embodiment of the present disclosure. FIG. 30 is a view showing a state in which a plurality of insertion holes are formed in the frame.

Referring to FIGS. 29 and 30, a plurality of third insertion holes 14 to which a plurality of first fixing members 50 may be coupled are formed in the frame 10, and a plurality of openings 230 disposed to face the plurality of third insertion holes 14 may be formed in the plurality of display modules LDM.

The first fixing member 50 may include a first nut 53 fixed to the opening 230 of the cover bottom 200, a second nut 52 disposed inside the first nut 53, and a second bolt 51 screw-coupled to the second nut 52. The first nut 53 of the first fixing member 50 may be fixed on the opening 230 in advance.

When the plurality of display modules LDM are disposed on the adsorption plate to finish the planarization work, the second bolt 51 may be coupled to the second nut 52 by being inserted into the third insertion hole 14 of the frame 10.

Figure 31A:
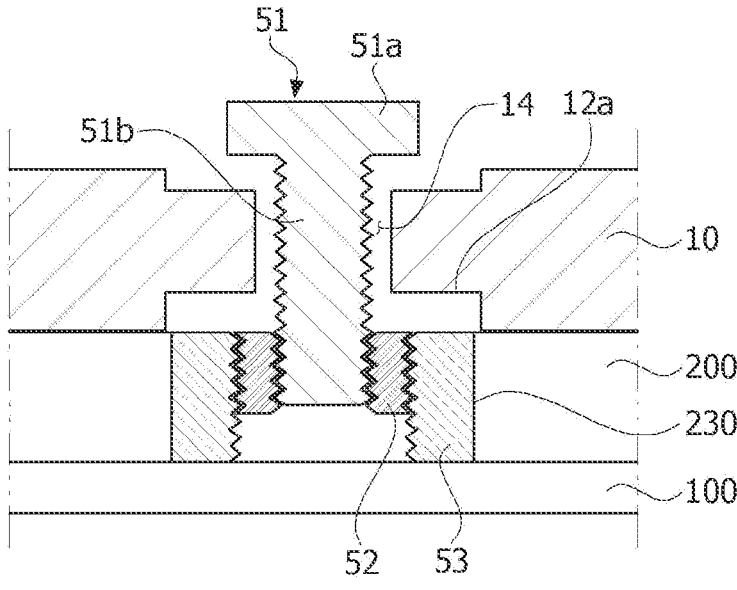
FIG. 31A is a view showing a second bolt coupled to a second nut in the display device of FIG. 30.
Figure 31B:
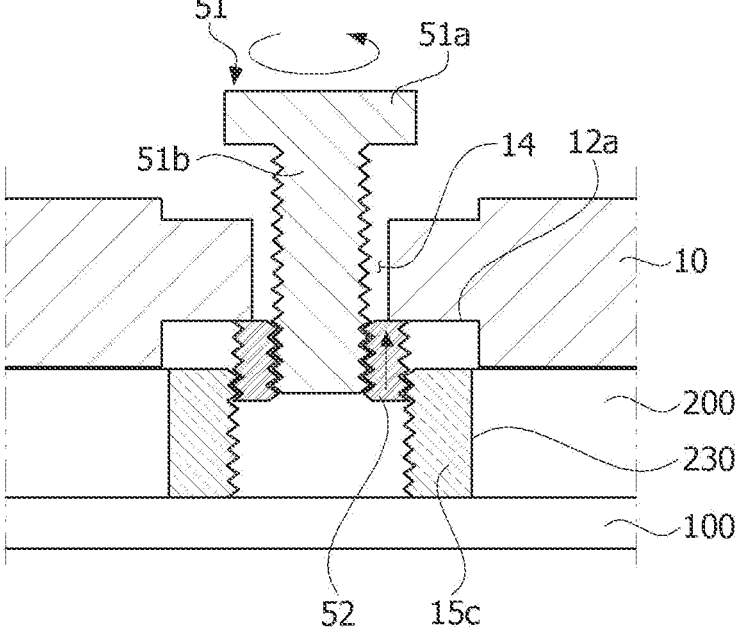
FIG. 31B is a view showing the second nut of FIG. 31A moved up by the rotation of the second bolt.

Referring to FIGS. 31A and 31B, when a threaded portion 51b of the second bolt 51 is inserted into the second nut 52 and rotates, the second nut 52 may move upward. A head portion 51a of the second bolt 51 may be disposed outside the frame 10. Since the first nut 53 is fixed to the opening 230 of the cover bottom 200, the second nut 52 moves up when the second bolt 51 rotates. When the second nut 52 is in contact with a fixing stopper 12a of the opening 230, the second nut 52 no longer moves upward.

Figure 31C:
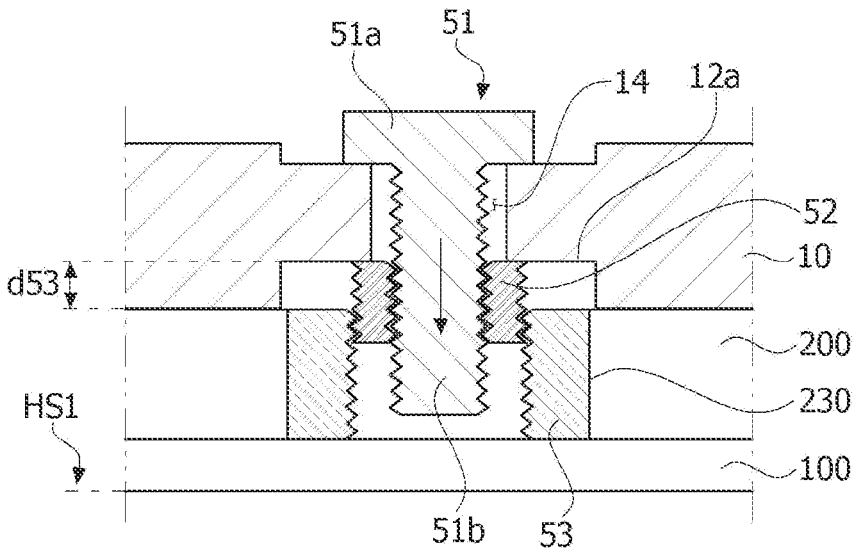
FIG. 31C is a view showing the second bolt of FIG. 31A moving downward.

Referring to FIG. 31C, when the second bolt 51 continuously rotates even after the second nut 52 is in contact with the fixing stopper 12a of the opening 230, the second bolt 51 may move down to fix the display module LDM to the frame 10. According to the embodiment, when the one surfaces of the plurality of display modules LDM are aligned on the adsorption plate 30, distances between the other side surfaces of the display modules LDM and the frame 10 may not be constant. Therefore, a height d53 to which the second nut 52 moves up may be different for each display module LDM. In other words, to adjust the one surfaces of the display modules LDM to be formed on the same plane, the second nut 52 may compensate an occurred step difference while moving upward.

Figure 32:
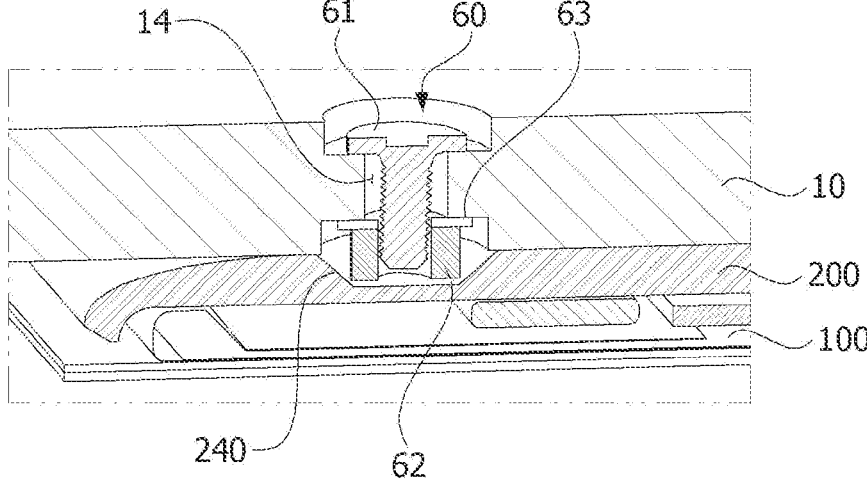
FIG. 32 is a view showing a display module fixed to a frame by a second fixing member in a display device according to an embodiment of the present disclosure.
Figure 33:
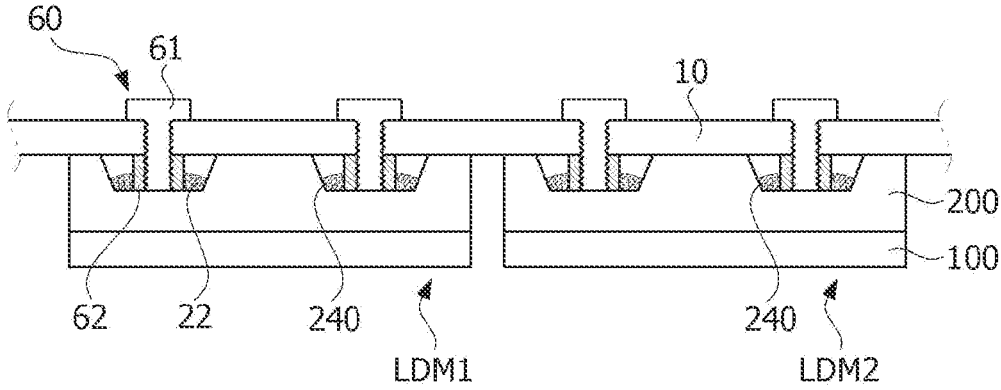
FIG. 33 is a view showing a plurality of display modules coupled together by the second fixing member of FIG. 32.
Figure 34A:
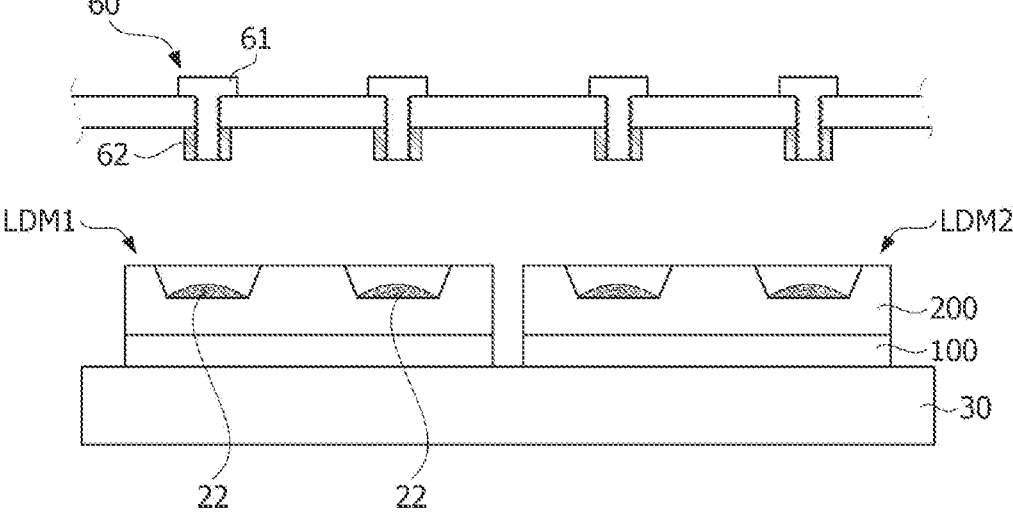
FIG. 34A is a view showing the plurality of display modules of FIG. 33 aligned on an adsorption plate.
Figure 34B:
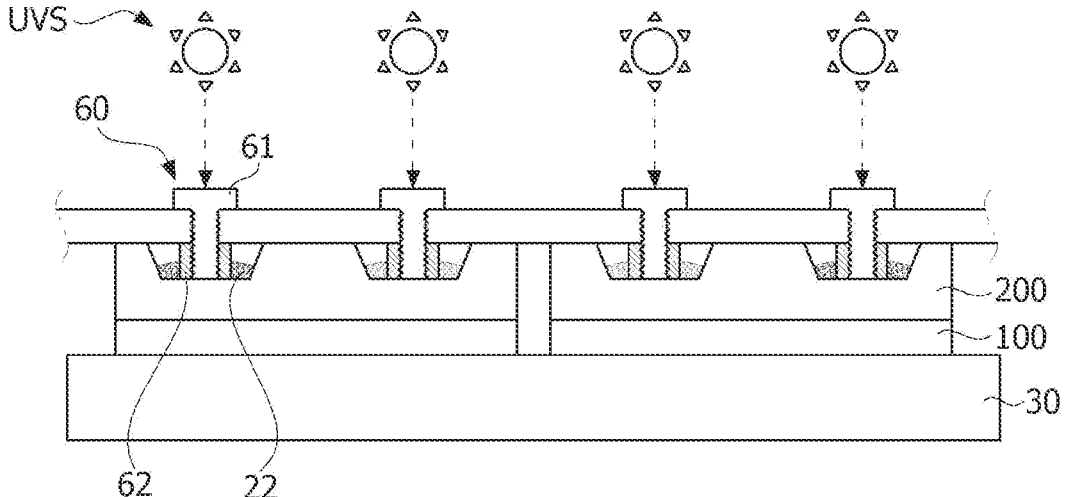
FIG. 34B is a view showing an adhesive member of the plurality of display modules of FIG. 33 cured by radiating ultraviolet light.

FIG. 32 is a view showing a state in which the display module is fixed to the frame of the display device according to another embodiment of the present disclosure by a second fixing member. FIG. 33 is a view showing a state in which the plurality of display modules are fixed by the second fixing member. FIG. 34A is a view showing a state in which the plurality of display modules are aligned on an adsorption plate. FIG. 34B is a view showing a state in which an adhesive member is cured by radiating ultraviolet light.

Referring to FIGS. 32 and 33, the plurality of third insertion holes 14 may be formed in the frame 10, and grooves 240 may be formed in the plurality of display modules LDM1 and LDM2. A third nut 62 may be fixed to the groove 240, and the third nut 62 may be coupled to the third bolt 61. A washer 63 may be disposed between the third nut 62 and the third bolt 61.

The groove 240 is filled with an adhesive member to fix the third nut 62 to the groove 240. The adhesive member may be an ultraviolet curable resin 22.

Referring to FIG. 34A, in a state in which the plurality of display modules LDM1 and LDM2 are aligned on the adsorption plate 30, the grooves 240 of the plurality of display modules LDM1 and LDM2 may be filled with the ultraviolet curable resin 22. The third bolt 61 and the third nut 62 of the second fixing member 60 may be fixed to the frame 10 in advance.

Thereafter, as shown in FIG. 34B, as the frame 10 moves down, the third nut 62 may be in contact with the ultraviolet curable resin 22. Thereafter, when ultraviolet light is radiated by an ultraviolet light source UVS, the ultraviolet curable resin 22 may be cured.

Figure 35:
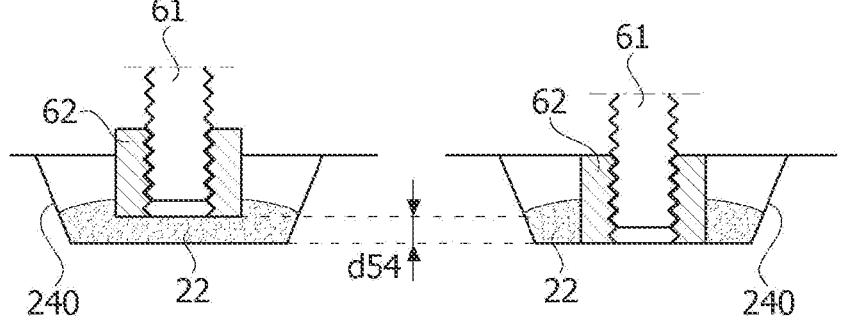
FIG. 35 is a view showing a plurality of third nuts disposed on an ultraviolet curable resin in the display device of FIG. 32.
Figure 36:
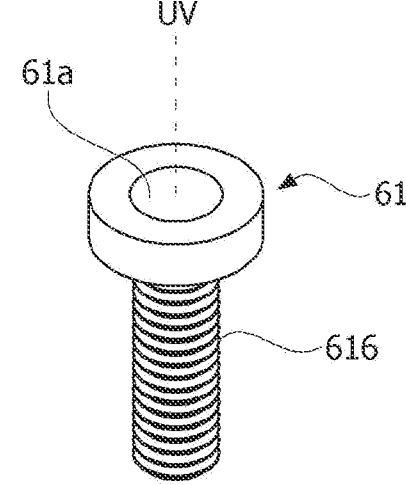
FIG. 36 is a view showing a third bolt of the second fixing member of FIG. 32.
Figure 37:
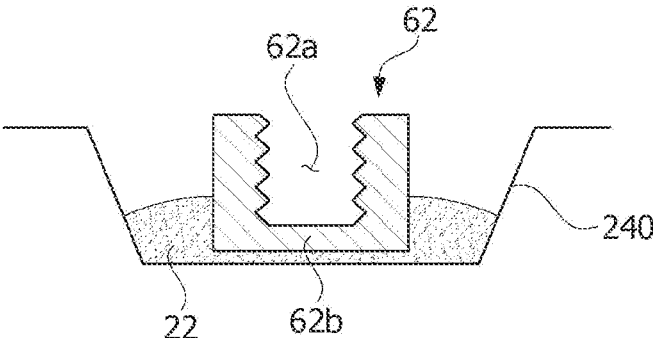
FIG. 37 is a view showing a third nut of the second fixing member of FIG. 32.
Figure 38:
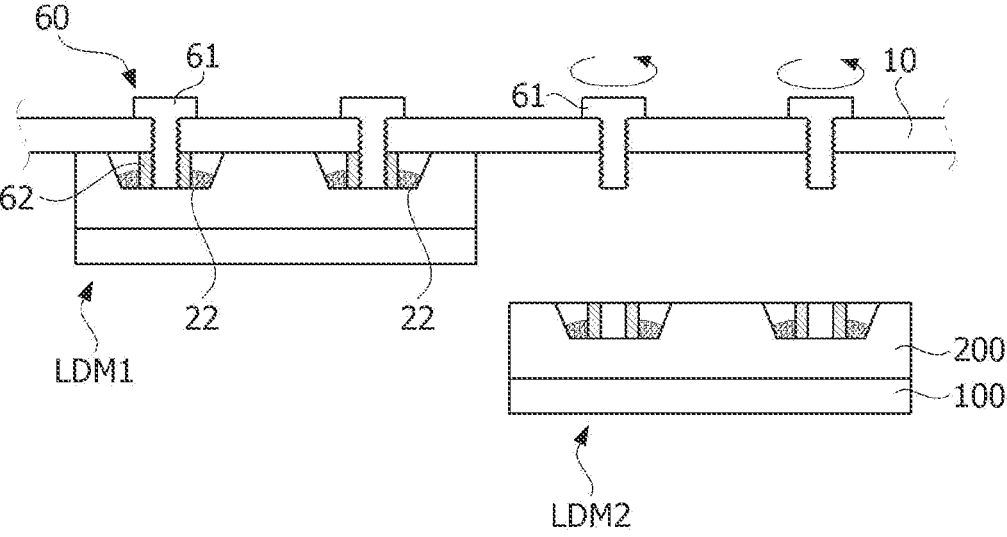
FIG. 38 is a view showing some of the plurality of display modules of FIG. 32 removed from the frame.

FIG. 35 is a view showing a state in which a plurality of third nuts are disposed on an ultraviolet curable resin. FIG. 36 is a view showing a third bolt of the second fixing member. FIG. 37 is a view showing a third nut of the second fixing member. FIG. 38 is a view showing a state in which some of the plurality of display modules are removed from the frame.

Referring to FIG. 35, a step difference may occur as the plurality of display modules LDM1 and LDM2 are aligned on the adsorption plate 30. Therefore, heights d54 of the third nuts 62 disposed in the grooves 240 formed in each of the display modules LDM1 and LDM2 may be different.

Some third nuts 62 may be in contact with a bottom surface of the groove 240 by being deeply inserted into the groove 240, and the other third nuts 62 may be shallowly inserted into the groove 240 so that the ultraviolet curable resin 22 may be disposed between the nut and the bottom surface.

In other words, a depth of the ultraviolet curable resin 22 inserted into the third nut 62 may be adjusted by the step generated while planarizing the one surfaces of the plurality of display modules LDM. Therefore, the one surfaces of the plurality of display modules LDM can maintain the planarized state.

The third bolt 61 and the third nut 62 may be made of a transparent material through which ultraviolet light may transmit. Therefore, when the ultraviolet light is radiated in a state in which the third bolt 61 and the third nut 62 are coupled to the frame 10, the ultraviolet light is radiated to the ultraviolet curable resin 22 through the third bolt 61 and the third nut 62.

Referring to FIG. 36, the third bolt 61 has a hole 61a formed therein to increase ultraviolet light transmittance. In other words, the ultraviolet light may be incident by transmitting the third bolt 61 and incident through the hole 61a. Referring to FIG. 37, the third nut 62 has a bottom surface 62b to prevent the ultraviolet curable resin 22 from flowing into an inside 62a of the third nut 62. Therefore, it is possible to prevent the ultraviolet curable resin 22 from being in contact with the third bolt 61.

Referring to FIG. 38, when some of the display modules LDM2 need to be replaced, some of the display modules LDM2 may be removed from the frame 10 by removing the third bolts 61 coupled to some of the display module LDM2. Since the ultraviolet curable resin 22 fixes only the third nut 62 to the groove 240, when the third bolt 61 is separated from the third nut 62, the corresponding display module LDM2 may be removed from the frame 10.

In view of the above, the concepts of the disclosure enable a tiled display device that eliminates steps between adjacent display modules that appear to a user or view as a seam without utilizing a separate planarization device. The display modules in the tiled device can also be planarized in a process that is faster and cheaper than conventional techniques. Other benefits and advantages of the techniques of the present disclosure are apparent from the foregoing description and accompanying drawings.

The above-described embodiments of the present disclosure can be summarized as follows.

The display device according to one aspect of the present disclosure includes a frame and a plurality of display modules coupled to the frame, wherein each of the plurality of display modules includes a display panel including a protection layer for covering a side line formed on a side surface of a substrate, and a cover film disposed on one surface of the display panel, the plurality of display modules are spaced apart from each other in a state of being coupled to the frame, and a separation distance between side surfaces of the protection layers and a separation distance between the side surfaces of the cover films of the plurality of display modules are the same.

The plurality of display modules include a cover bottom disposed on the other surface of the display panel, and a separation distance between the cover bottoms of the plurality of display modules may be greater than a separation distance between the protection layers.

The cover bottom may not overlap the protection layer.

The plurality of display modules may include a plurality of electrode pads disposed at edges of the one surfaces thereof and electrically connected to the side lines, and shapes of the electrode pads disposed on facing side surfaces of the neighboring display modules among the plurality of display modules may differ from each other.

The plurality of display modules may include the plurality of electrode pads disposed at the edges of the one surfaces thereof and electrically connected to the side lines, and the shapes of the electrode pads disposed on the facing side surfaces of the neighboring display modules among the plurality of display modules may be the same.

The cover bottom may include a plurality of protrusions protruding toward the frame, and the frame may include a plurality of insertion holes into which the plurality of protrusions are inserted.

The protrusion may be formed by cutting and bending a portion of the cover bottom.

The display device may include a resin filling the insertion hole to fix the protrusion.

The frame may include a plurality of sub-frames and fixing pins for coupling the plurality of sub-frames, and the plurality of sub-frames may be coupled to the plurality of display modules, respectively.

The plurality of protrusions may include long holes and include first bolts for passing through the long holes to fix the plurality of protrusions to the frame.

The display device may include first fixing members for fixing the plurality of display modules to the frame, wherein the first fixing member may include a first nut inserted into an opening hole formed in the display module, a second nut disposed inside the first nut, and a second bolt coupled to the second nut, the second nut may move upward when the second bolt rotates, and the second bolt may move downward when the upward movement of the second nut is blocked by the frame.

The display device may include second fixing members for fixing the plurality of display modules to the frame, wherein the second fixing member may include a third nut disposed in an opening groove formed in the display module, and a third bolt coupled to the third nut, and the third nut may be fixed to the opening groove by an adhesive member.

The adhesive member may include an ultraviolet curable resin, and the third bolt and the third nut may include a material which transmits ultraviolet light.

The plurality of display modules may include a plurality of micro LEDs.

The display device according to another aspect of the present disclosure includes a frame, a plurality of display modules coupled to the frame, and fixing members for fixing the plurality of display modules to the frame, wherein the plurality of display modules are spaced apart from each other in a state of being coupled to the frame, each of the plurality of display modules includes a display panel and a cover bottom which is disposed on one surface of the display panel and on which a plurality of protrusions are disposed, the frame includes a plurality of insertion holes into which the plurality of protrusions are inserted, and the fixing members fix the protrusions to the insertion holes.

The fixing member may include a resin.

The fixing member may include a bolt.

The protrusion may be formed by cutting and bending a portion of the cover bottom.

The plurality of display modules may each include a display panel including a protection layer for covering the side line formed on the side surface of the substrate, and a cover film disposed on one surface of the display panel.

In some of the plurality of display modules, depths to which the protrusions are inserted into the plurality of insertion holes may be different.

According to a display device of the type described herein, it is possible to reduce a step between a plurality of display modules without an additional planarization component.

In addition, it is possible to replace some of the plurality of display modules fixed to a frame.

In addition, it is possible to reduce expensive die casting and high-degree polishing costs.

In addition, it is possible to enable precise flat assembly even when a size of the display device increases.

In addition, it is possible to enable flat assembly for a short time without work such as precise adjustment and enable the flat assembly without an expensive measurement device.

Various and beneficial advantages and effects of the embodiments are not limited to the above-described contents, and other effects that are not mentioned will be able to be clearly understood by those skilled in the art from the following description.

Since the contents of the specification described in the above-described technical problem, technical solution, and advantageous effects do not specify the essential features of the claims, the scope of the claims is not limited by the items described in the contents of the specification.

Although embodiments of the present disclosure have been described in more detail with reference to the accompanying drawings, the present disclosure is not necessarily limited to these embodiments, and various modifications may be carried out without departing from the technical spirit of the present disclosure. Therefore, the embodiments disclosed in the present disclosure are not intended to limit the technical spirit of the present disclosure, but for describing it, and the scope of the technical spirit of the present disclosure is not limited by these embodiments. Therefore, it should be understood that the above-described embodiments are illustrative and not restrictive in all respects. The scope of the appended claims is not limited by the foregoing description, and all technical spirits within the equivalent range should be construed as being included in the scope of the present claims.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a frame; and
a plurality of display modules coupled to the frame, wherein each of the plurality of display modules includes:
a display panel having a first surface and a second surface opposite to the first surface, including:
a substrate having a side surface;
a side line on the side surface of the substrate; and
a protection layer having a side surface, wherein the protection layer covers at least a portion of the side line; and
a cover film disposed on the first surface of the display panel,
wherein the plurality of display modules are spaced apart from each other on the frame,
wherein each of the plurality of display modules includes a bottom cover disposed on the second surface of the display panel,
wherein the bottom cover includes a plurality of protrusions extending toward the frame and the plurality of protrusions include fastener holes, and
wherein fasteners are configured to couple to the fastener holes to fix the plurality of protrusions to the frame.

2. The display device of claim 1, wherein a first separation distance between sides surfaces of the protection layers and a second separation distance between side surfaces of the cover films of the plurality of display modules on the frame are the same, and
wherein a third separation distance between side surfaces of the bottom covers of the plurality of display modules is greater than the first separation distance between side surfaces of the protection layers.

3. The display device of claim 2, wherein the bottom cover does not overlap the protection layer.

4. The display device of claim 2, wherein the frame includes a plurality of insertion holes into which the plurality of protrusions are inserted.

5. The display device of claim 4, wherein the protrusion is a portion of the bottom cover.

6. The display device of claim 4, further comprising a resin filling the insertion hole to fix the protrusion.

7. The display device of claim 6, wherein the frame includes a plurality of sub-frames and fixing pins configured to couple the plurality of sub-frames together, and
the plurality of sub-frames are coupled one-to-one to the plurality of display modules.

8. The display device of claim 1, wherein the plurality of display modules each include a plurality of electrode pads disposed at edges thereof and electrically connected to the side lines, and
wherein shapes of the plurality of electrode pads disposed on facing side surfaces of neighboring display modules of the plurality of display modules are different.

9. The display device of claim 1, wherein the plurality of display modules include a plurality of electrode pads disposed at edges thereof and electrically connected to the side lines, and
wherein shapes of the plurality of electrode pads disposed on facing side surfaces of neighboring display modules of the plurality of display modules are the same.

10. The display device of claim 1, wherein the plurality of display modules include a plurality of micro light emitting diodes.

11. A display device, comprising:
a frame;
a plurality of display modules coupleable to the frame, each of the plurality of display modules including:
a display panel having a first surface and a second surface;
a bottom cover disposed on the second surface of the display panel; and
a plurality of fasteners configured to fix the plurality of display modules to the frame, with the plurality of display modules spaced apart from each other on the frame,
wherein each of the plurality of fasteners includes a first nut inserted into an opening hole in one of the plurality of display modules, a second nut disposed inside the first nut, and a bolt coupled to the second nut, and
wherein the second nut is configured to move upward when the bolt rotates, and the bolt is configured to move downward in response to the upward movement of the second nut being blocked by the frame.

12. A display device, comprising:
a frame;
a plurality of display modules coupleable to the frame, each of the plurality of display modules including:
a display panel having a first surface and a second surface;
a bottom cover disposed on the second surface of the display panel, and a plurality of fasteners configured to fix the plurality of display modules to the frame, wherein the plurality of display modules are spaced apart from each other on the frame,
wherein each of the plurality of fasteners includes a nut disposed in a groove formed in one of the plurality of display modules, and a bolt coupled to the nut, and
an adhesive between the nut and the groove to couple the nut to the groove.

13. The display device of claim 12, wherein the adhesive member is an ultraviolet curable resin, and
the bolt and the nut include a material which transmits ultraviolet light.

\* \* \* \* \*